United States Patent
Uetake et al.

(10) Patent No.: US 8,938,138 B2
(45) Date of Patent: Jan. 20, 2015

(54) OPTICAL SEMICONDUCTOR DEVICE AND METHOD OF MANUFACTURING OPTICAL SEMICONDUCTOR DEVICE

(71) Applicant: Fujitsu Limited, Kawasaki-shi (JP)

(72) Inventors: Ayahito Uetake, Isehara (JP); Kazumasa Takabayashi, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 209 days.

(21) Appl. No.: 13/707,004

(22) Filed: Dec. 6, 2012

(65) Prior Publication Data

US 2013/0202248 A1 Aug. 8, 2013

(30) Foreign Application Priority Data

Feb. 8, 2012 (JP) .................................. 2012-025264

(51) Int. Cl.
| | |
|---|---|
| *G02B 6/00* | (2006.01) |
| *G02B 6/36* | (2006.01) |
| *G02B 6/12* | (2006.01) |
| *H01L 21/36* | (2006.01) |

(52) U.S. Cl.
CPC . *G02B 6/12* (2013.01); *H01L 21/36* (2013.01)
USPC ........................................... 385/14; 385/147

(58) Field of Classification Search
USPC ............... 385/14, 15, 16, 129, 147, 131, 132; 438/31; 257/E21
See application file for complete search history.

(56) References Cited

U.S. PATENT DOCUMENTS

| | | | | |
|---|---|---|---|---|
| 5,783,844 | A | * 7/1998 | Kobayashi et al. ............ | 257/103 |
| 5,841,929 | A | * 11/1998 | Komatsu et al. ............... | 385/129 |
| 7,125,735 | B2 | 10/2006 | Takeuchi | |
| 7,539,385 | B2 | 5/2009 | Uetake et al. | |
| 7,816,157 | B2 | * 10/2010 | Katsuyama ..................... | 438/29 |
| 8,670,058 | B2 | * 3/2014 | Hayashi et al. ................ | 348/296 |
| 2008/0029787 | A1 | * 2/2008 | Watanabe et al. .............. | 257/233 |
| 2009/0008684 | A1 | * 1/2009 | Kuroda ........................... | 257/292 |
| 2009/0200449 | A1 | * 8/2009 | Iwata et al. .................... | 250/206 |

FOREIGN PATENT DOCUMENTS

| | | |
|---|---|---|
| JP | 2003-69149 | 3/2003 |
| JP | 2003-107260 | 4/2003 |
| JP | 2005-223300 | 8/2005 |
| JP | 2008-177405 | 7/2008 |

* cited by examiner

*Primary Examiner* — Akm Enayet Ullah
(74) *Attorney, Agent, or Firm* — Fujitsu Patent Center

(57) ABSTRACT

An optical semiconductor device includes: a waveguide unit which is formed on a semiconductor substrate including a (100) plane and includes a core layer which propagates light; a spot size converting unit which is formed on the semiconductor substrate, is optically connected to the waveguide unit, and converts diameter of light propagated; and a pair of terraces which are formed on the semiconductor substrate and are opposed to each other while sandwiching the spot size converting unit. Interval between opposed units which are opposed to each other while sandwiching the spot size converting unit in the pair of terraces changes, and each of the opposed units includes a part whose orientation tilts to a [0-11] direction with respect to a [011] direction, and position of an upper end of the spot size converting unit is higher than that of an upper end of the waveguide unit.

16 Claims, 31 Drawing Sheets

FIG.3
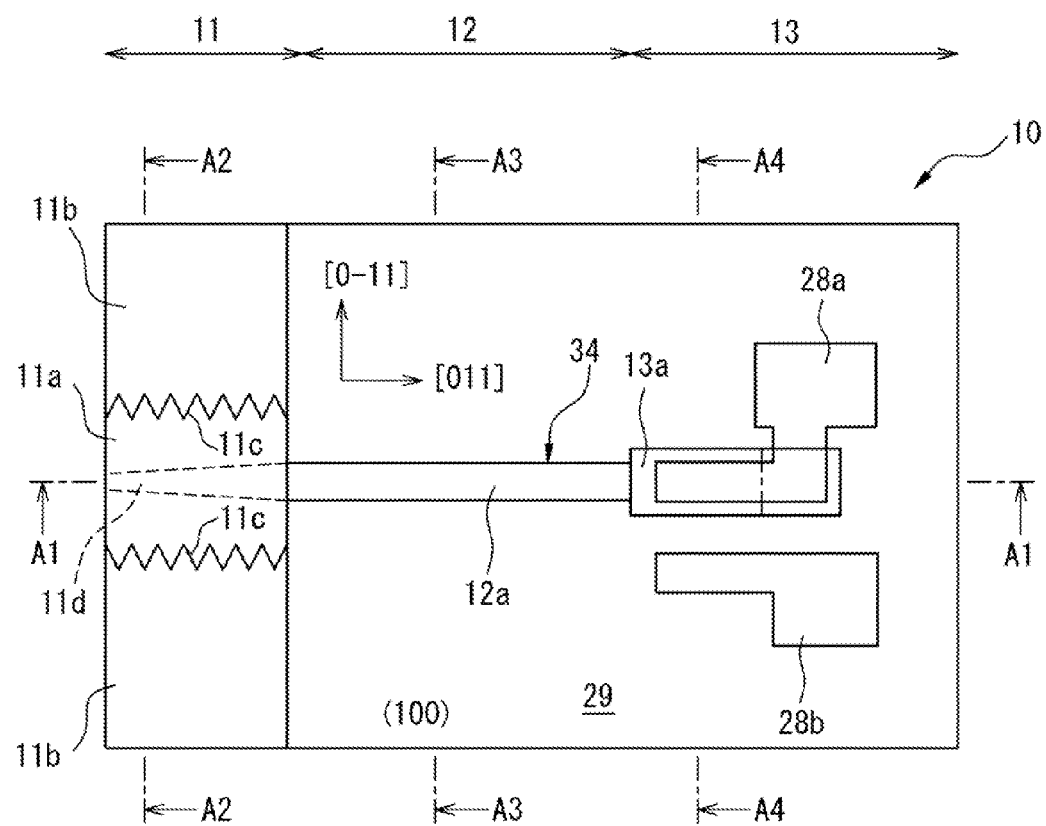
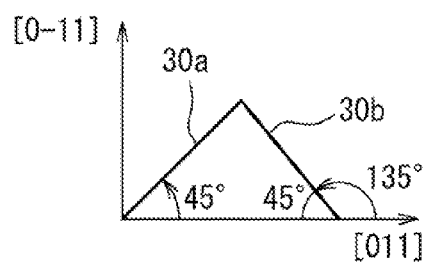

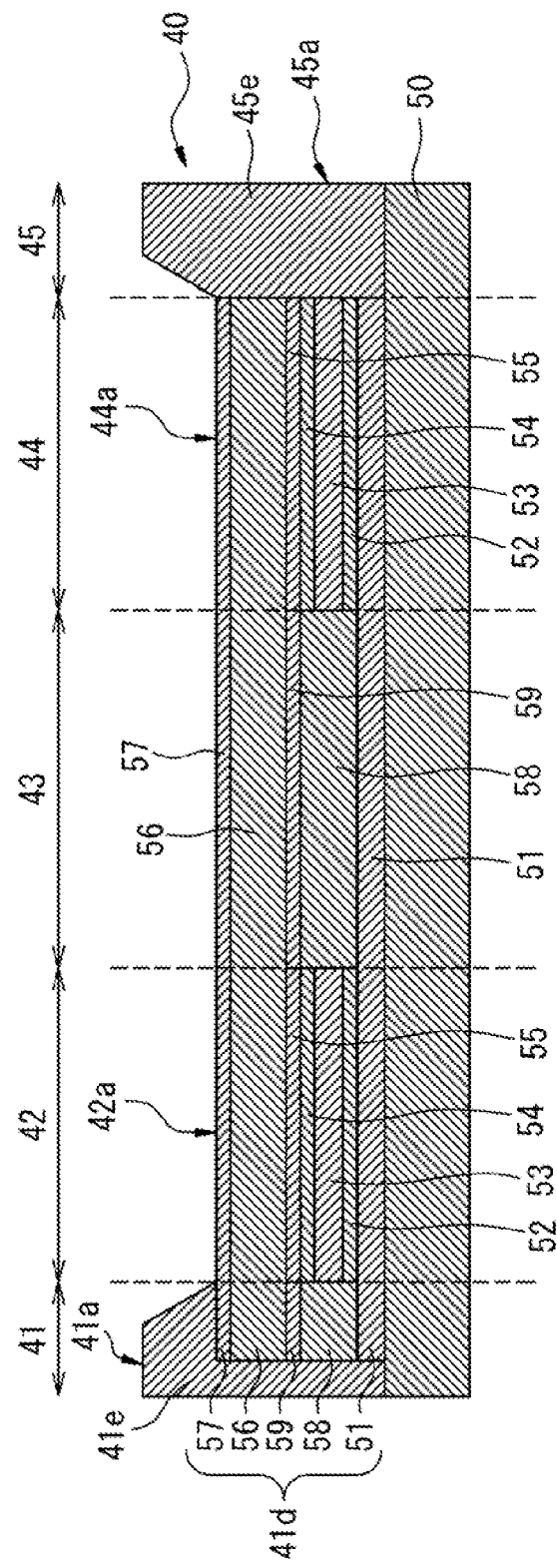

FIG.30A
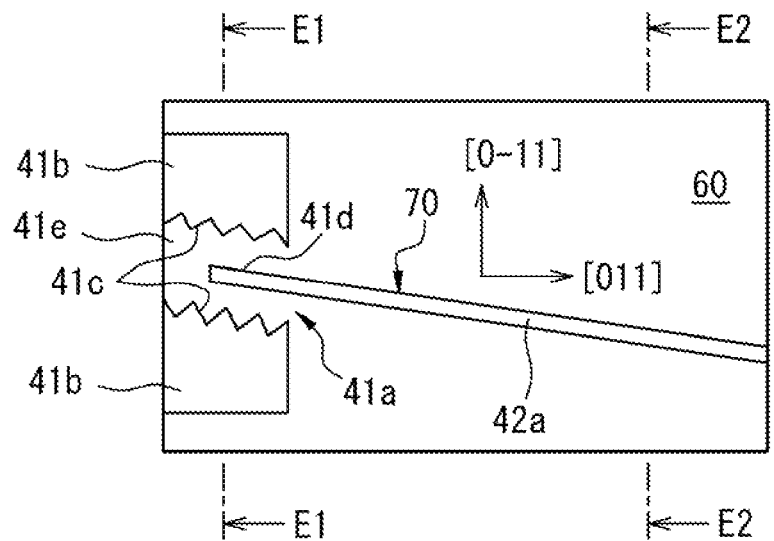
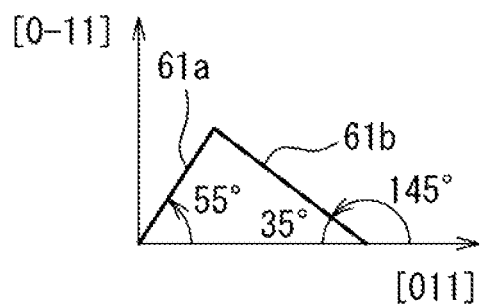
FIG.30B
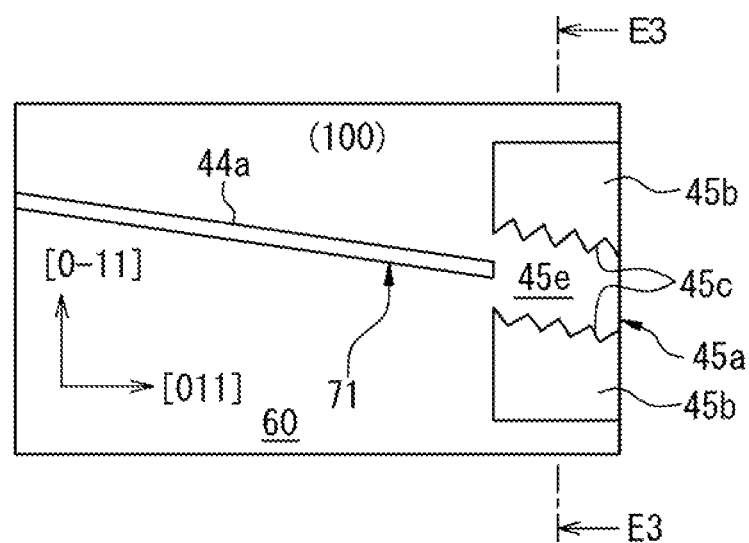

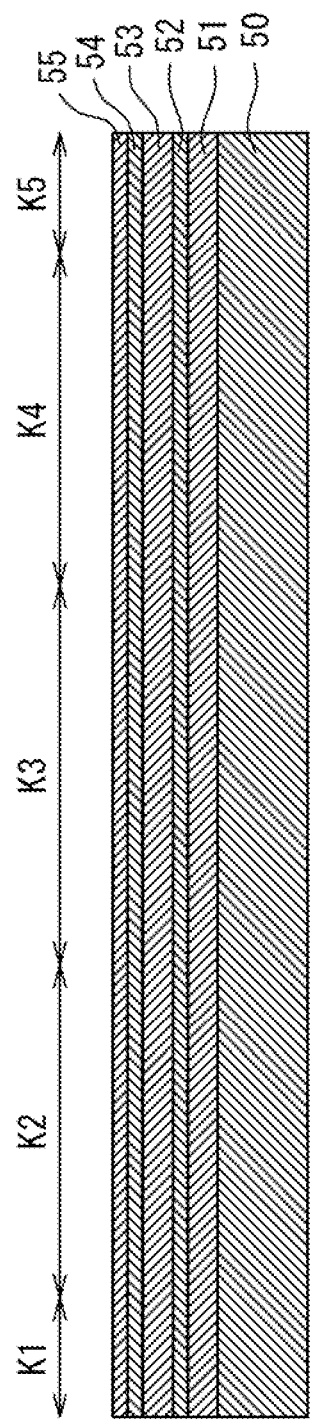

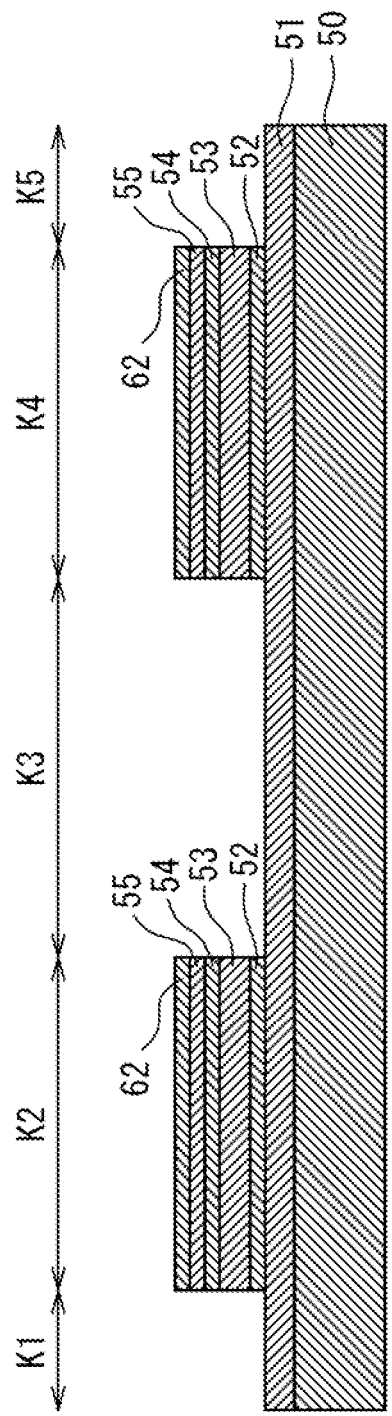

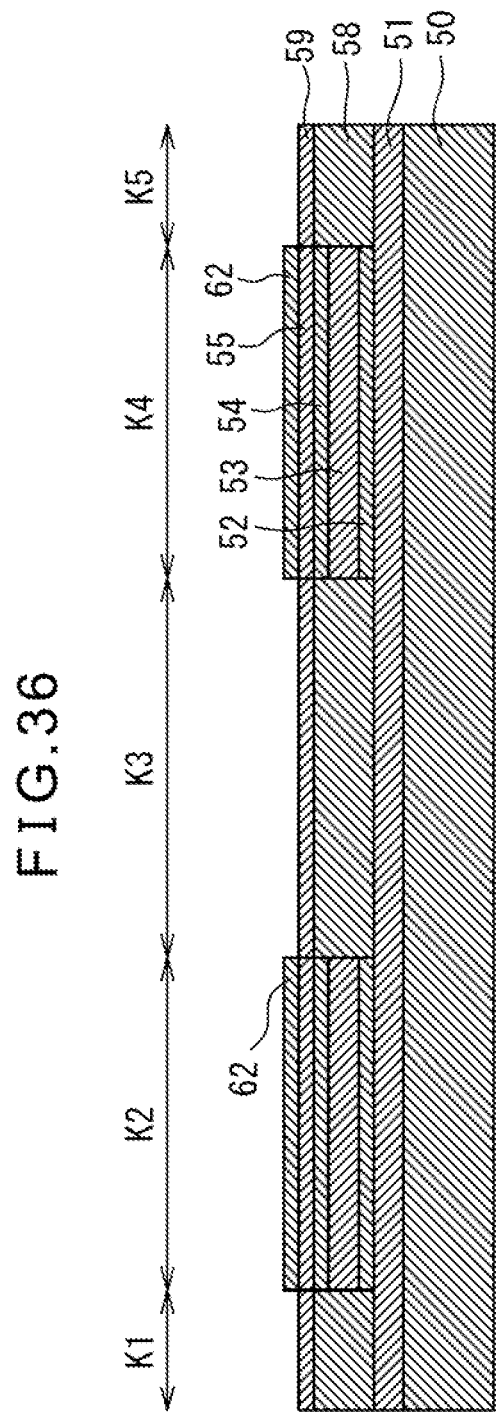

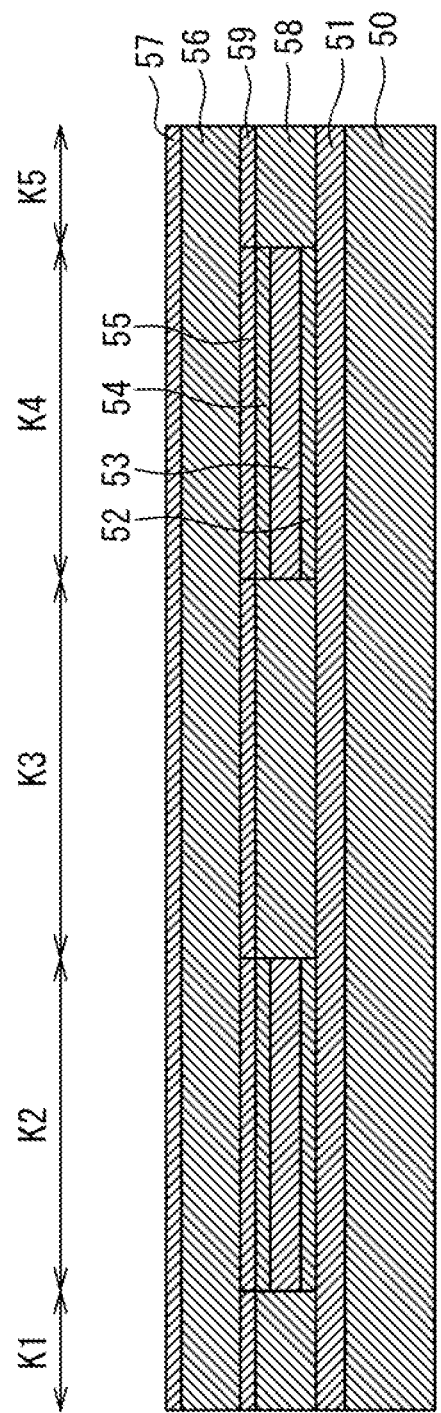

OPTICAL SEMICONDUCTOR DEVICE AND METHOD OF MANUFACTURING OPTICAL SEMICONDUCTOR DEVICE

CROSS-REFERENCE TO RELATED APPLICATION

This application is based upon and claims the benefit of priority of the prior Japanese Patent Application No. 2012-025264, filed on Feb. 8, 2012, the entire contents of which are incorporated herein by reference.

FIELD

The present invention relates to an optical semiconductor device and a method of manufacturing an optical semiconductor device.

BACKGROUND

In optical communication, an optical semiconductor device such as a semiconductor laser, a semiconductor photodetector, or a semiconductor optical amplifier is used. As the communication amount increases, it is necessary for an optical semiconductor device to operate stably at higher speed.

An optical semiconductor device uses a buried-heterostructure (BH) of a current narrowing structure in which a stripe-shaped mesa unit is buried by using the metal organic vapor phase epitaxy (MOVPE). An optical semiconductor device including the BH can operate stably for a long time.

As a semiconductor laser including the BH, an SI-BH (semi-insulating buried heterostructure) in which a mesa unit including an active layer is buried with a semi-insulating semiconductor layer is known. In a semiconductor laser having the SI-BH, parasitic capacitance of a device as a factor of regulating a modulation bandwidth can be reduced. Consequently, it is advantageous to modulate operation at a high bit rate.

In both a semiconductor photodetector and a semiconductor optical amplifier, using the BH reduces the parasitic capacitance in a device, and realizes higher-speed operation.

From the viewpoint of reduction in the size of an apparatus or simplification of manufacturing process, an optical semiconductor integrated device in which a plurality of optical semiconductor devices are integrated monolithically on the same substrate has been developed.

In such an optical semiconductor integrated device, a device including a mesa structure can be disposed in a predetermined direction on a semiconductor substrate in accordance with the disposing relation with other devices.

Because of cleavableness in the [011] direction or the [0-11] direction, an optical semiconductor device is usually fabricated on the substrate having (100) plane direction.

When the orientation in the longitudinal direction of the mesa structure disposed on the (100) plane has a component of tilt toward the [0-11] direction with respect to the [011] direction, a burying layer which buries the mesa structure grows from both sides of the mesa structure so as to cover the upper side of the mesa structure.

FIG. 1 is a diagram depicting a conventional optical semiconductor device. FIG. 2A is an enlarged cross section taken along line Z1-Z1 of FIG. 1. FIG. 2B is an enlarged cross section taken along line Z2-Z2 of FIG. 1.

An optical semiconductor device 100 includes a semiconductor substrate 105 having the (100) plane, a mesa unit 101 disposed on the semiconductor substrate 105, and a burying layer 104 which buries the mesa unit 101.

The mesa unit 101 includes a core layer 102, a contact layer 103, and a mask 106. The orientation in the longitudinal direction of the mesa unit 101 has a component of tilt toward the [0-11] direction with respect to the [011] direction. Both waveguide end faces in the longitudinal direction of the mesa unit 101 are disposed on the inner side of the cleavage facet of the device, and both waveguide end faces in the longitudinal direction of the mesa unit 101 have the [0-11] direction.

Since the orientation in the longitudinal direction of the mesa unit has the component of tilt toward the [0-11] direction with respect to the [011] direction, the burying layer 104 is formed so as to cover from both sides of the mesa unit 101 to the upper side of the mesa unit 101. The reason is that the burying layer 104 grown along the both side faces of the mesa unit 101 includes a component of growth in a plane tilted from the (011) plane toward the <111>A direction. Consequently, growth in the (111)A plane direction appears above the mesa unit 101, and the burying layer 104 grows so as to cover the mesa like eaves. Particularly, the burying layer 104 is formed so as to cover the upper part of the mesa unit 101 in both end faces in the longitudinal direction of the mesa unit 101 which is the [0-11] direction.

When the top of the mesa unit 101 is covered with the burying layer 104 as described above, it is difficult to form an electrode on the contact layer 103 in the following process.

On the other hand, when the orientation in the longitudinal direction of the mesa unit has only the [011] direction component and the mesa unit extends to the cleavage positions at both ends of the device, the burying layer is not formed so as to cover the mesa unit from both sides of the mesa unit. However, when the orientation in the longitudinal direction of the mesa unit is limited to the [011] direction, design flexibility is limited.

It is therefore proposed to suppress growth of the burying layer over the mesa structure by adding gas containing chlorine to process gas for forming the burying layer.

By adding gas containing chlorine to process gas, even when the orientation in the longitudinal direction of the mesa structure has a component of tilt toward the [0-11] direction with respect to the [011] direction or even when the end faces in the longitudinal direction of the mesa structure are disposed on the inner side of the cleavage position of the device, growth mode of the (111)A plane is suppressed. Consequently, the burying layer which buries the mesa structure is formed without being grown like eaves. Since growth mode of the (100) plane is also suppressed, the burying layer which buries the mesa structure is formed in the same thickness as that of the mesa unit 101 in predetermined distance on both sides of the mesa structure and the thickness decreases after the predetermined distance from the mesa unit 101.

Japanese Laid-open Patent Publication No. 2005-223300
Japanese Laid-open Patent Publication No. 2008-177405
Japanese Laid-open Patent Publication No. 2003-069149
Japanese Laid-open Patent Publication No. 2003-107260

SUMMARY

In connection between an optical semiconductor integrated device and an optical fiber, coupling loss of light occurs due to the difference between the spot size of light in the end face of the optical semiconductor integrated device and the spot size of the optical fiber. This is because the spot size of light of a waveguide of the optical semiconductor integrated device is smaller than that of the optical fiber.

As a method of enlarging the spot size of an optical waveguide in an end face of an optical semiconductor integrated device, there is a method of increasing the thickness of a cladding layer on the upper side of the optical waveguide. To increase the thickness of a cladding layer on the upper side of the optical waveguide near the end face of the optical semiconductor integrated device, after a mask above a mesa of the optical waveguide near the end face is removed, at the time of forming a burying layer which buries a mesa structure, there is a case that a burying layer is grown also above the mesa structure and formed as a cladding layer.

However, as described above, when forming a burying layer which buries a mesa structure by adding gas containing chlorine to process gas, growth of the (100) plane in the thickness direction is suppressed. Consequently, even when the mask on the mesa in the optical waveguide near the end faces is removed, the burying layer is not formed as much on the mesa structure, and the cladding layer is not thickly formed on the optical waveguide near the end faces of the optical semiconductor integrated device.

On the other hand, when forming the burying layer which buries the mesa structure by using process gas which does not contain chlorine after removal of the mask on the mesa in the optical waveguide near the end faces, although the cladding layer can be formed on the optical waveguide near the end faces of the optical semiconductor integrated device, the device is limited to the layout in which the orientation in the longitudinal direction of the mesa unit is limited to the [011] direction and the longitudinal direction of the mesa unit extends to the cleavage position of the device as described above. There is problem with regard to design flexibility.

According to an aspect of the embodiment of an optical semiconductor device disclosed in the specification, an optical semiconductor device includes: a waveguide unit which is formed on a semiconductor substrate having a (100) plane and includes a core layer which propagates light; a spot size converting unit which is formed on the semiconductor substrate, is optically connected to the waveguide unit, and converts diameter of light propagated; and a pair of terraces which are formed on the semiconductor substrate and opposed to each other while sandwiching the spot size converting unit. Interval between opposed units which are opposed to each other while sandwiching the spot size converting unit in the pair of terraces changes, and each of the opposed units includes a part whose orientation tilts to a [0-11] direction with respect to a [011] direction, and position of an upper end of the spot size converting unit is higher than that of an upper end of the waveguide unit.

According to an aspect of the embodiment of a method of manufacturing an optical semiconductor device disclosed in the specification, the method includes: forming, on a semiconductor substrate having a (100) plane, a mesa unit including a shape extending in one direction and a pair of terraces sandwiching a region extending from the mesa unit along the longitudinal direction of the mesa unit toward a direction opposite to the mesa unit, the mesa unit and the pair of terraces being formed so that opposed units which are opposed to each other while sandwiching the region in the pair of terraces include a part whose orientation tilts in a [0-11] direction with respect to a [011] direction; and forming a first semiconductor layer in the region between the pair of terraces and forming a second semiconductor layer which buries the mesa unit on both sides of at least a part of the mesa unit, position of an upper end of the first semiconductor layer being higher than that of an upper end of the mesa unit.

The object and advantages of the embodiments will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram depicting a first embodiment of an optical semiconductor integrated device disclosed in the specification.

FIG. 29 is an enlarged cross section taken along line D1-D1 of FIG. 28.

FIG. 30A is an enlarged diagram of a region R1 in FIG. 28.

FIG. 30B is an enlarged diagram of a region R2 in FIG. 28.

FIG. 34 is a diagram depicting a process (No. 1) of a second embodiment of a method of manufacturing an optical semiconductor integrated device disclosed in the specification.

FIG. 35 is a diagram depicting a process (No. 2) of the second embodiment of the method of manufacturing an optical semiconductor integrated device disclosed in the specification.

FIG. 36 is a diagram depicting a process (No. 3) of the second embodiment of the method of manufacturing an optical semiconductor integrated device disclosed in the specification.

FIG. 37 is a diagram depicting a process (No. 4) of the second embodiment of the method of manufacturing an optical semiconductor integrated device disclosed in the specification.

DESCRIPTION OF EMBODIMENTS

[a] First Embodiment

Hereinafter, a preferred first embodiment of an optical semiconductor integrated device disclosed in the specification will be described with reference to the drawings. The technical scope of the present invention is not limited to the embodiments but includes the invention described in the scope of claims and its equivalents.

Figure 1:
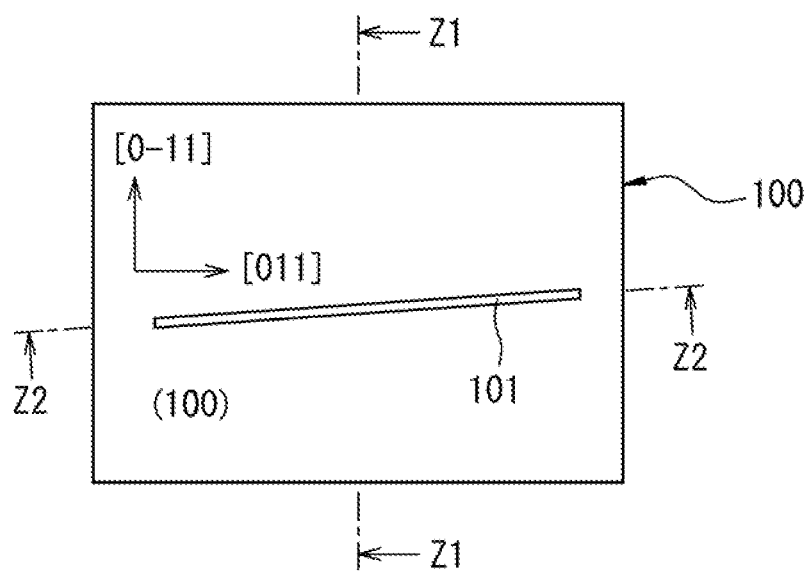
FIG. 1 is a diagram depicting a conventional optical semiconductor device.
Figure 2A:
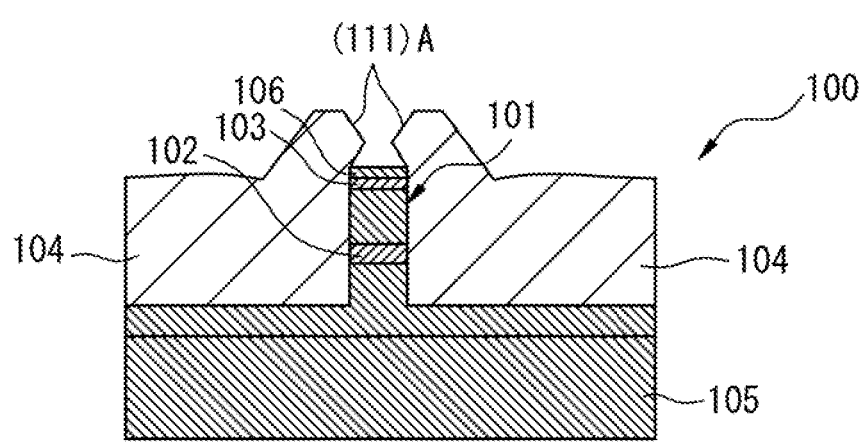
FIG. 2A is an enlarged cross section taken along line Z1-Z1 of FIG. 1.
Figure 2B:
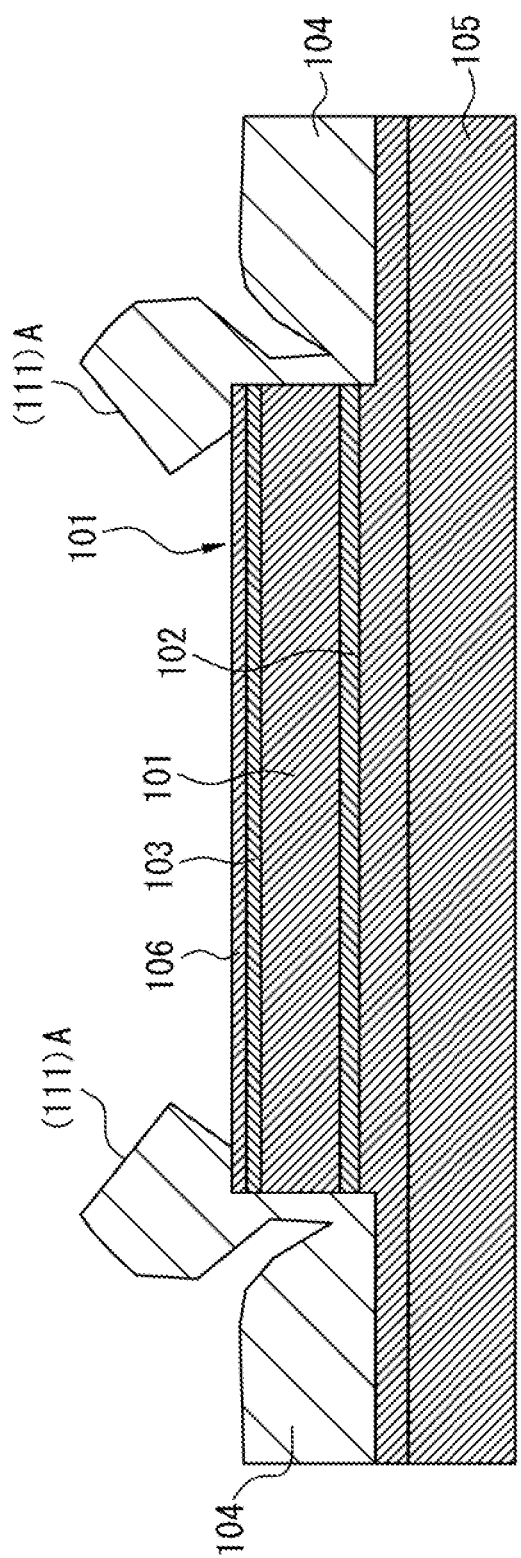
FIG. 2B is an enlarged cross section taken along line Z2-Z2 of FIG. 1.
Figure 4:
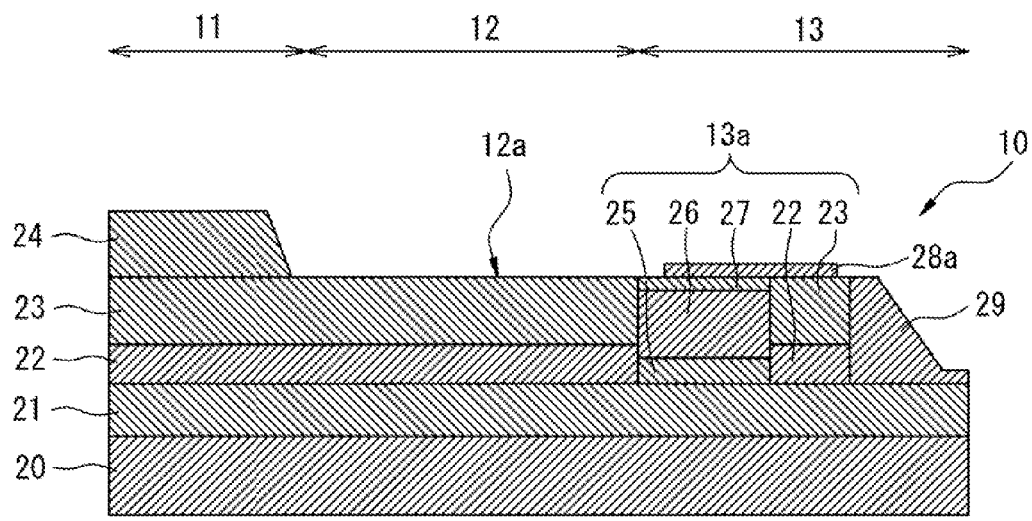
FIG. 4 is a cross section taken along line A1-A1 of FIG. 3.
Figure 5:
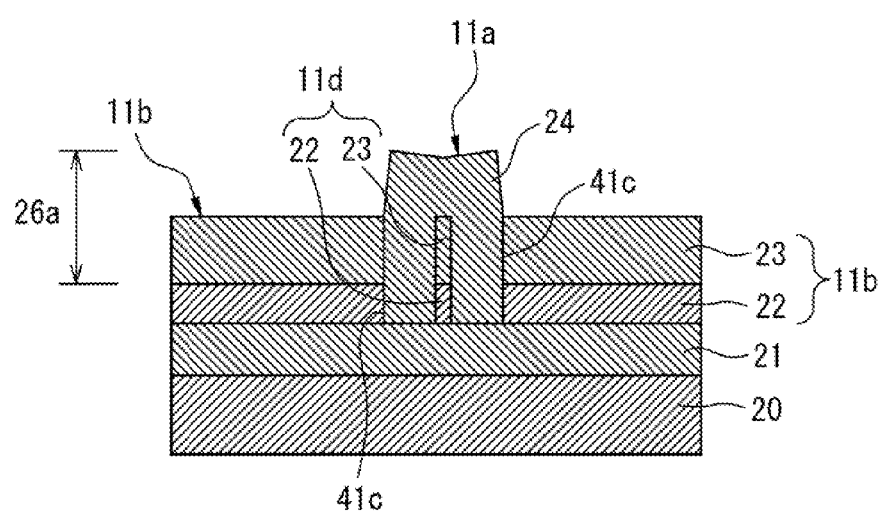
FIG. 5 is a cross section taken along line A2-A2 of FIG. 3.
Figure 6:
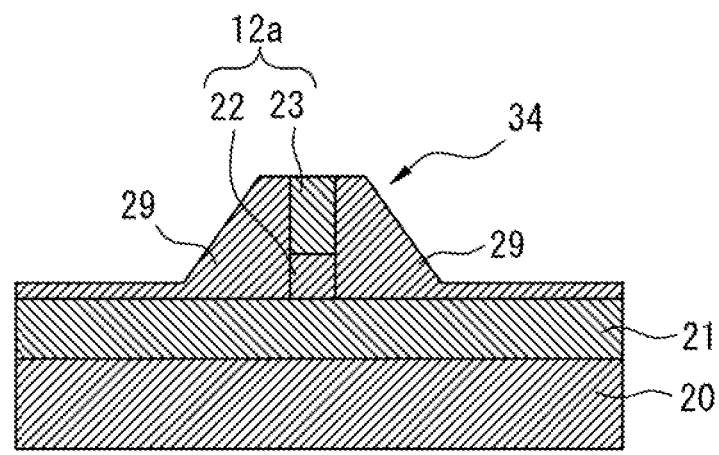
FIG. 6 is a cross section taken along line A3-A3 of FIG. 3.
Figure 7:
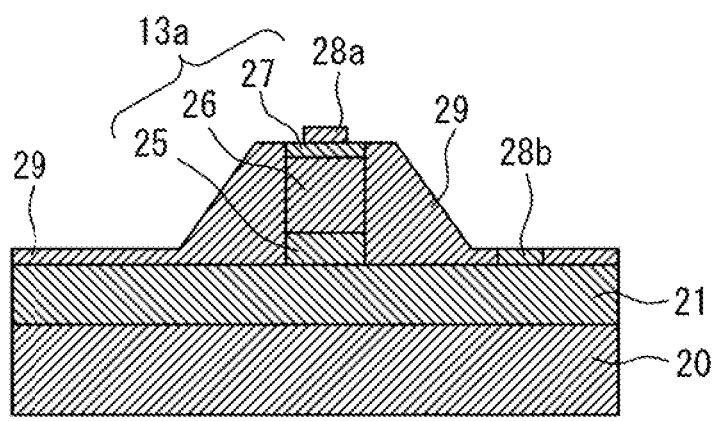
FIG. 7 is a cross section taken along line A4-A4 of FIG. 3.
Figure 8:
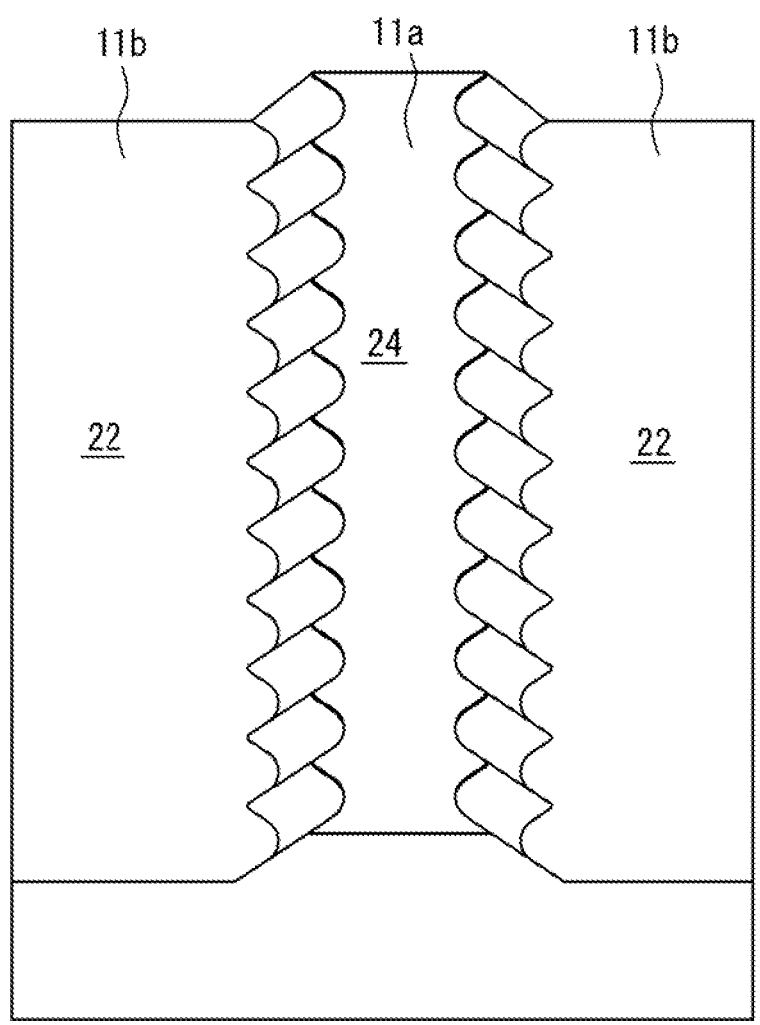
FIG. 8 is a diagram depicting a spot size converting unit in FIG. 3.

FIG. 3 is a diagram depicting a first embodiment of an optical semiconductor integrated device disclosed in the specification. FIG. 4 is a cross section taken along line A1-A1 of FIG. 3. FIG. 5 is a cross section taken along line A2-A2 of FIG. 3. FIG. 6 is a cross section taken along line A3-A3 of FIG. 3. FIG. 7 is a cross section taken along line A4-A4 of FIG. 3. FIG. 8 is a diagram depicting a spot size converting unit in FIG. 3.

An optical semiconductor integrated device 10 of the embodiment includes a semiconductor substrate 20 having a (100) plane and an input unit 11 disposed on the (100) plane of the substrate 20, converting the spot size of light from the outside, and inputting the resultant light. The optical semiconductor integrated device 10 also includes a waveguide 12 for propagating the light from the input unit 11 and a photodetector 13 receiving the light propagated through the waveguide 12. The waveguide 12 and the photodetector 13 are also disposed on the (100) plane of the substrate 20.

The waveguide 12 includes a mesa unit 12a and a first burying layer 29 as semiconductor which buries the mesa unit 12a. The mesa unit 12a extends in the [011] direction.

The photodetector 13 includes a mesa unit 13a and the first burying layer 29 burying the mesa unit 13a. The mesa unit 13a extends in the [011] direction. The first burying layer 29 is formed in both of the waveguide 12 and the photodetector 13.

In the specification, a plane index to be expressed by "1 with a bar" will be expressed as "−1". The meaning of the [0-11] direction includes the [01-1] direction which is crystallographically equivalent to the [0-11] direction. The meaning of the [011] direction includes the [0-1-1] direction which is crystallographically equivalent to the [011] direction.

The input unit 11 receives light propagating through an optical fiber or the like from the outside, converts the spot size of the light to smaller size, and outputs the resultant light to the mesa unit 12a in the waveguide 12. The spot size of the light propagating through an optical fiber is larger than that of light propagating through the mesa unit 12a in the waveguide 12. Consequently, the input unit 11 reduces the spot size of the light which is incident from the outside and propagates the resultant light to the mesa unit 12a in the waveguide 12.

The optical semiconductor integrated device 10 may convert the spot size of light by using a lens together with the input unit 11.

The input unit 11 includes a spot size converting unit 11a propagating light to/from the mesa unit 12a and a pair of terraces 11b opposed to each other over the spot size converting unit 11a.

As depicted in FIG. 5, the spot size converting unit 11a includes a mesa unit 11d for propagating light to/from the mesa unit 12a of the wave guide 12, and a second burying layer 24 as semiconductor which buries both sides and the upper side of the mesa unit 11d. The mesa unit 11d extends in the [011] direction. AS depicted in FIGS. 3 and 4, the mesa unit 11d of the spot size converting unit 11a is formed integrally with the mesa unit 12a of the waveguide 12.

As depicted in FIG. 3, the width of the mesa unit 11d increases in a tapered shape from the end face side of the optical semiconductor integrated device 10 toward the waveguide 12 side. As the width of the mesa unit 11d increases, the field intensity distribution of the waveguide mode is narrowed. Consequently, the spot size of light is reduced as the light propagates through the mesa unit 11d.

In the specification, the spot size as the diameter of light may denote mode field diameter (MFD) of light. The mode field diameter of light expresses the degree of extension of an electric field in a direction orthogonal to the light propagation direction and is defined as distance at which the field intensity of light decreases only by $1/e^2$ from that in the peak position.

Each of opposed units 11c which are opposed to each other while sandwiching the spot size converting unit 11a in the pair of terraces 11b includes a part of the direction tilted toward the [0-11] direction with respect to the [011] direction. In the embodiment, the interval between the opposed units 11c of the pair of terraces 11b cyclically repeatedly increases and decreases.

In the example depicted in FIG. 3, the opposed unit 11c includes a plane 30a having a direction of 45° from the [011] direction toward the [0-11] direction and a plane 30b having a direction of 135° from the [011] direction toward the [0-11] direction. The opposed unit 11c is formed by alternately disposing the planes 30a and 30b and has a pattern of a triangular wave shape. The projection positions and the recessed positions in the pattern of the triangular wave shape coincide between the opposed units 11c.

The reason why the opposed unit 11c includes the part in the direction tilted toward the [011] direction is to make the position of the upper end of the second burying layer 24 in the input unit 11 higher than that of the upper end of the mesa unit 12a of the waveguide 12, as depicted in FIG. 4.

In the optical semiconductor integrated device 10, by disposing the thick second burying layer 24 together with a first upper cladding layer 23 over a core layer 22 in the spot size converting unit 11a, the spot size of light near the end face is enlarged. The second burying layer 24 is formed by growing on both sides and the upper side of the mesa unit 11d of the input unit 11 together with the first burying layer 29 when forming the first burying layer 29 which buries the mesa unit 12a in the waveguide 12.

The first burying layer 29 and the second burying layer 24 are formed by adding gas containing chlorine to process gas in order to suppress growth, on the mesa unit 12a, of the first burying layer 29 which buries the mesa unit 12a of the waveguide 12. When the opposed unit 11c includes the part whose orientation tilts toward the [011] direction, a part which grows in a crystal plane in which growth in the thickness direction is not suppressed by the gas containing chlorine appears in the opposed unit 11c. The part which grows in the crystal plane in which growth in the thickness direction is not suppressed by the gas containing chlorine grows upward from each of the opposed units 11c and, after that, grows toward the opposed side, and the grown parts from the opposed units 11c combine. Therefore, the second burying layer 24 is formed thickly. In such a manner, the second burying layer 24 which buries the mesa unit 11d in the spot size converting unit 11a is formed and, as depicted in FIG. 6, the first burying layer 29 which buries the mesa unit 12a in the waveguide 12 is formed.

When the positions of the projections of the opposed units 11c coincide, the distance between the opposed units 11c becomes short, so that time necessary for combining parts of the second burying layer 24 growing in the lateral direction is shortened.

It is sufficient that the opposed unit 11c includes a part having an orientation tilted toward the [0-11] direction with respect to the [011] direction. The opposed unit 11c may have a non-periodic shape.

It is sufficient that the interval between the pair of terraces 11b changes, and the opposed unit 11c does not have a shape as depicted in FIG. 3. For example, the opposed unit 11c may have a sine wave pattern.

The interval between the opposed units 11c may monotonically decrease or increase.

The interval between the opposed units 11c is preferably larger than the mode field diameter of light propagating through the input unit 11 from the viewpoint of suppressing a loss of the propagating light.

Next, a concrete structure of the optical semiconductor integrated device 10 will be further described.

As depicted in FIG. 4, the optical semiconductor integrated device 10 includes a lower cladding layer 21 disposed on the substrate 20. The lower cladding layer 21 is disposed in the input unit 11, the waveguide 12, and the photodetector 13.

Hereinafter, the structure of the input unit 11 will be described.

As depicted in FIGS. 4 and 5, in the mesa unit 11d of the input unit 11, the core layer 22 is disposed on the lower cladding layer 21, and the first upper cladding layer 23 is disposed on the core layer 22. The mesa unit 11d of the input unit 11 is formed by the core layer 22 and the first upper cladding layer 23. As depicted in FIG. 3, the core layer 22 extends in the spot size converting unit 11a while being narrowed from the waveguide 12 side toward the input end face of the optical semiconductor integrated device 10. The core layer 22 extends from the waveguide 12 side to the input end face of the optical semiconductor integrated device 10 in the spot size converting unit 11a.

The both sides and the upper side of the mesa unit 11d are buried with the second burying layer 24. The second burying layer 24 is disposed on the upper cladding layer 21 while burying the mesa unit 11d.

Preferably, the refractive index of the lower cladding layer 21, the first upper cladding layer 23, and the second burying layer 24 is lower than that of the core layer 22 from the viewpoint of confining the propagating light in the core layer 22.

On each side of the spot size converting unit 11a, the core layer 22 and the first upper cladding layer 23 are disposed in order on the lower cladding layer 21. With the stack structure, the pair of terraces 11b is formed. The position of the upper end of the terrace 11b coincides with the position of the upper end of the mesa unit 12a of the waveguide 12.

As depicted in FIG. 5, the position of the upper end of the spot size converting unit 11a is higher than that of the upper end of the terraces 11b. As depicted in FIG. 8, the portion higher than the terraces 11b in the spot size converting unit 11a has a shape corresponding to the parts 30a and 30b tilted to the [0-11] direction with respect to the [011] direction in the opposed units 11c. Concretely, the part higher than the terraces 11b, of the spot size converting unit 11a has an irregular shape corresponding to the triangular-wave-shaped pattern.

Preferably, the position of the upper end of the spot size converting unit 11a is higher than that of the upper end of the spot size of light in the end face of the optical semiconductor integrated device 10 from the viewpoint of reducing a light coupling loss.

The structure of the waveguide 12 will now be described.

As depicted in FIGS. 4 and 6, in the mesa unit 12a of the waveguide 12, the core layer 22 is disposed on the lower cladding layer 21, and the first upper cladding layer 23 is disposed on the core layer 22. The mesa unit 12a of the waveguide 12 is formed by the core layer 22 and the first upper cladding layer 23. The core layer 22 of the mesa unit 12a is formed integrally with the core layer of the mesa unit 11d in the input unit 11. In other words, the core layer 22 of the waveguide 12 extends in the spot size converting unit 11a. Light which enters the input unit 11 propagates through the core layer 22 and enters the photodetector 13.

Both sides of the mesa unit 12a are buried with the first burying layer 29. The first burying layer 29 is formed in the same thickness as that of the mesa unit 12a in predetermined distance on both sides of the mesa unit 12a, and the thickness decreases after the predetermined distance from the mesa unit 12a. On the mesa unit 12a, the first burying layer 29 is not formed. By the mesa unit 12a and the first burying layer 29, an optical waveguide 34 is formed. The spot size converting unit 11a converts the diameter of light propagated to the optical waveguide 34.

Next, the structure of the photodetector 13 will be described.

As depicted in FIGS. 4 and 7, in the mesa unit 13a of the photodetector 13, a light absorption layer 25 is disposed on the lower cladding layer 21, and a third upper cladding layer 26 is disposed on the light absorption layer 25. A contact layer 27 is disposed on the third upper cladding layer 26, and a first electrode 28a is disposed on the contact layer 27. The mesa unit 13a of the photodetector 13 is formed by the light absorption layer 25, the third upper cladding layer 26, and the contact layer 27. The mesa unit 13a includes a part in which the core layer 22 and the first upper cladding layer 23 are stacked.

As depicted in FIG. 7, both sides of the mesa unit 13a are buried with the first burying layer 29. The first burying layer 29 is formed in the same thickness as that of the mesa unit 13 in predetermined distance on both sides of the mesa unit 13a, and the thickness decreases after the predetermined distance from the mesa unit 13a. On the mesa unit 13a, the first burying layer 29 is not formed. A part of the first burying layer 29 is removed and, in the removed part, a second electrode 28b is disposed on the lower cladding layer 21.

The light propagated through the core layer 22 in the waveguide 12 enters the light absorption layer 25 of the photodetector 13. The light absorption layer 25 which receives the light absorbs the light and generates an electron-hole pair. By the voltage applied to the first and second electrodes 28a and 28b, electric field is applied to the light absorption layer 25. Electrons or holes generated by the light absorption are extracted from the first and second electrodes 28a and 28b, and light is detected as a change in current. A region of detecting the light is formed by a part of the lower cladding layer 22, the light absorption layer 25, the first upper cladding layer 26, and the contact layer 27 of the mesa unit 13a.

Preferably, the electric insulation property of the first burying layer 29 is high so that current is confined in the mesa unit 13a. Therefore, the resistivity of the second burying layer 24 formed together with the first burying layer 29 is preferably higher than that of the first upper cladding layer 26 and the contact layer 27.

Figure 9:
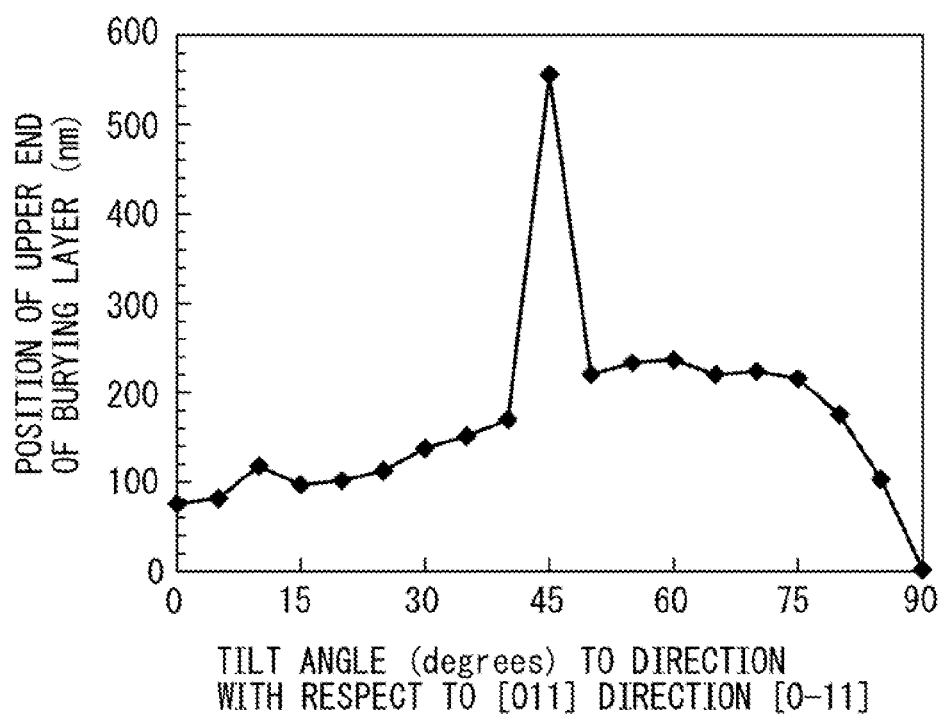
FIG. 9 is a diagram expressing the relation between distance between the position of an upper end of a burying layer and the position of an upper end of a mesa unit and the direction extending in the longitudinal direction of the mesa unit.

The inventors of the present invention conducted the following experiments to check the relation between the tilt angle to the [0-11] direction with respect to the [011] direction of the opposed unit in the terrace and the distance between the position of the upper end of the optical waveguide 34 and the position of the upper end of the spot size converting unit. The mesa units whose orientation in the longitudinal direction tilts at various angles from the [110] direction to the [0-11] direction were formed. Using gas obtained by adding an organochlorine material to the process gas, a burying layer as semiconductor was formed on both sides of the mesa unit by the MOVPE. FIG. 9 depicts the result of examination of the relation between the distance between the position of the upper end of the burying layer and the position of the upper end of the mesa unit and the orientation extending in the longitudinal direction of the mesa unit. The orientation extending in the longitudinal direction of the mesa unit is expressed by the tilt angle to the [0-11] direction with respect to the [011] direction. The position of the upper end of the burying layer as the vertical axis of FIG. 9 denotes the distance between the position of the upper end of the burying layer and the position of the upper end of the mesa structure.

In FIG. 9, while changing the angle of tilting the orientation in the longitudinal direction of the mesa unit from the [011] direction toward the [0-11] direction within the range of 0° to 90°, the distance of the difference between the position of the upper end of the burying layer and the position of the upper end of the mesa unit is measured.

The data depicted in FIG. 9 was measured by the following experiment. The width of the mesa structure was 45 μm, and the height was 3 μm. As process gas, as materials of forming the burying layer, trimethyl indium, phosphine, and ferrocene were used and, as gas containing chlorine, 1,2-dichloroethylene was used. The burying layer was formed by the MOVPE method.

As depicted in FIG. 9, to raise the position of the upper end of the burying layer, preferably, each of the opposed units 11c which are opposed to each other while sandwiching the spot size converting unit 11a in the pair of terraces 11b includes a part tilted at 30 degrees to 85 degrees from the [011] direction toward the [0-11] direction. Particularly, each of the opposed units 11c has, preferably, a part tilted at 40 degrees to 50 degrees from the [011] direction toward the [0-11] direction. Further, each of the opposed units 11c preferably has a part tilted at 45 degrees from the [011] direction toward the [0-11] direction. The part tilted at 30 degrees to 85 degrees from the [011] direction toward the [0-11] direction includes a part tilted at +30 degrees to +85 degrees from the [011] direction toward the [0-11] direction and a part tilted at −30 degrees to −85 degrees from the [011] direction toward the [0-11] direction. This is also applied to the other angles.

Next, suppression of a light coupling loss caused by the difference in spot sizes by the optical semiconductor integrated device 10 will be specifically described with reference to the drawings.

Figure 10:
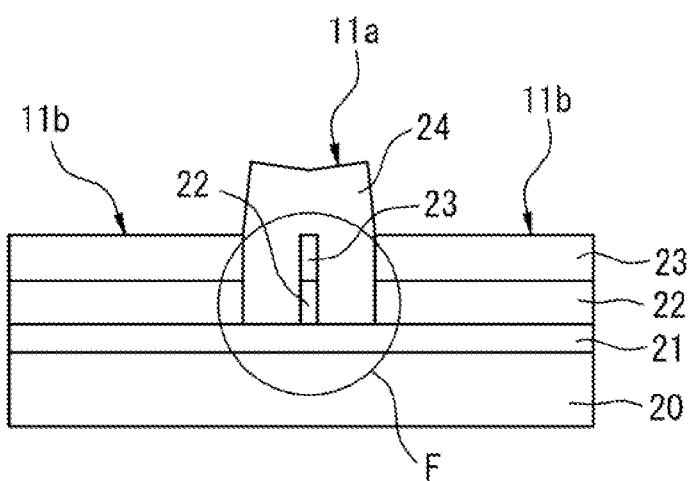
FIG. 10 is a diagram depicting light propagating through the optical semiconductor integrated device depicted in FIG. 3.
Figure 11:
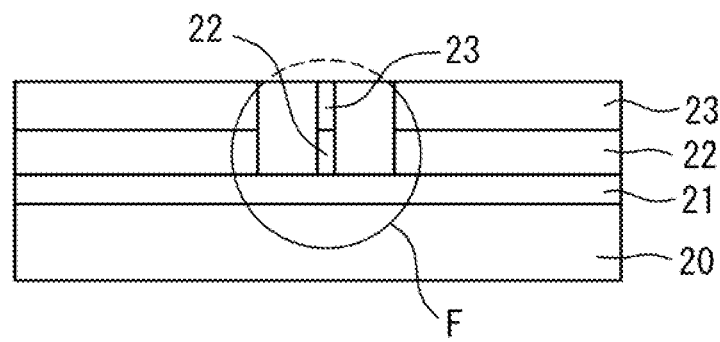
FIG. 11 is a diagram of light propagating through the optical semiconductor integrated device from which a part of a second burying layer, upper than a terrace unit, is removed.

FIG. 10 is a diagram depicting light propagating in the optical semiconductor integrated device depicted in FIG. 3. FIG. 11 is a diagram depicting light propagating through the optical semiconductor integrated device from which a part of a second burying layer, upper than a terrace unit, is removed.

In FIG. 10, circle F indicates the mode field diameter of light propagating through the input unit 11 of the optical semiconductor integrated device 10. A part of the circle F is upper than the upper end of the terraces 11b but lies within the second burying layer 24. Therefore, in the light propagating through the input unit 11, a part of the mode field diameter propagates in the optical semiconductor integrated device 10.

On the other hand, in the example depicted in FIG. 11, the part indicated by a chain line in the circle F lies out of the optical semiconductor integrated device, so that a part of the propagating light is lost. Therefore, a part of the light received from the optical fiber is lost without being coupled to the optical semiconductor integrated device.

Figure 12:
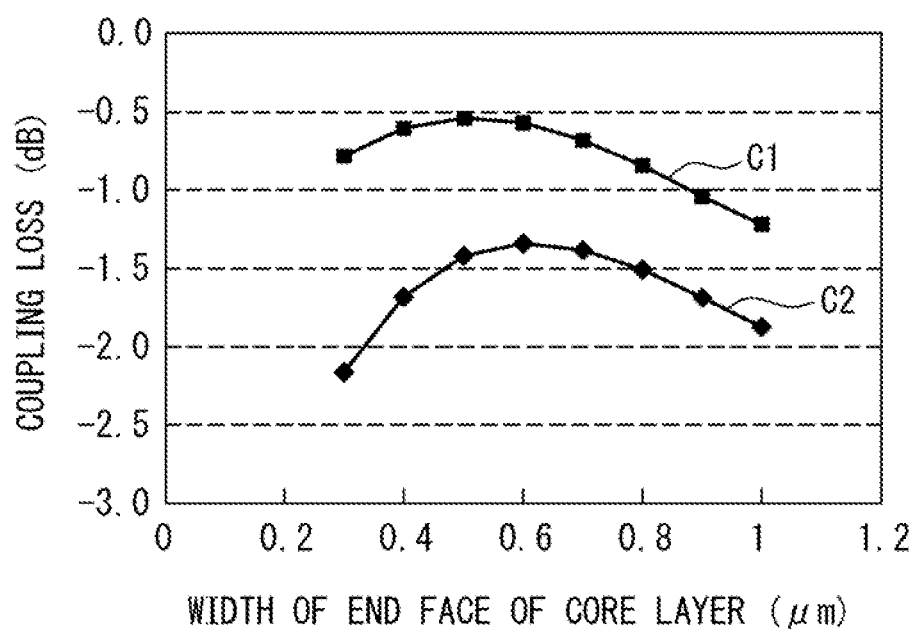
FIG. 12 is a diagram expressing the relation between the width of an end face of a core layer and coupling loss.

A result of quantitative examination of a coupling loss of light from an optical fiber, which enters the optical semiconductor integrated device is expressed in FIG. 12.

Figure 13:
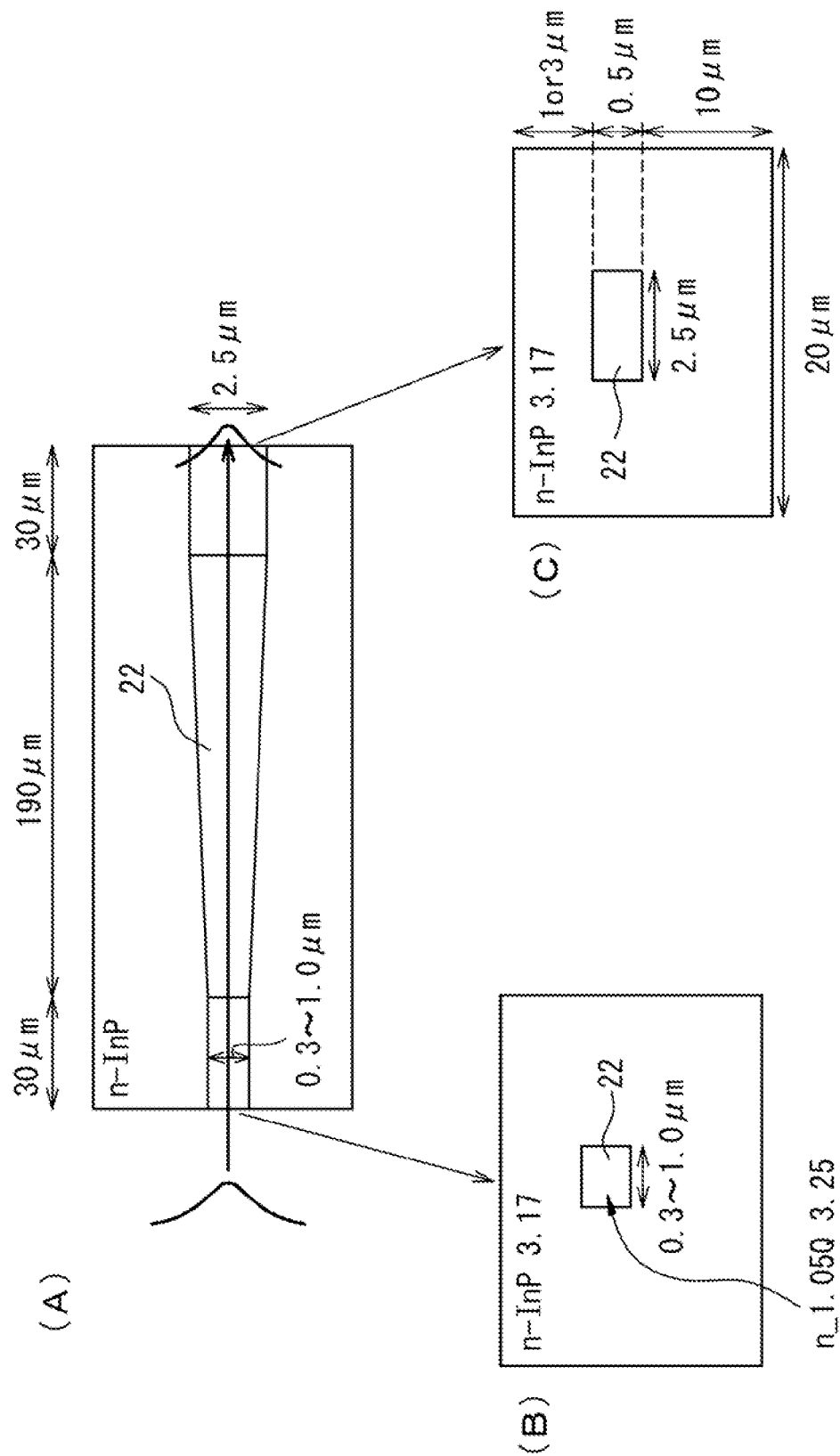
FIG. 13 is diagrams depicting calculation of the relation expressed in FIG. 12.

FIG. 12 is a diagram depicting the relation between the width of an end face of the core layer and coupling loss. FIG. 13 is a diagram depicting calculation of the relation expressed in FIG. 12.

FIG. 12 depicts curve C1 expressing the relation between the width of an end face of a core layer and coupling loss in an optical semiconductor integrated device corresponding to FIG. 10, and curve C2 expressing the relation between the width of an end face of a core layer and coupling loss in an optical semiconductor integrated device corresponding to FIG. 11.

The coupling loss in FIG. 12 was calculated using a model depicted in FIG. 13. In the model, the core layer 22 of the input unit 11 was disposed in an n-InP having n-type conductivity. The core layer 22 was an InGaAsP waveguide having a composition wavelength of 1.05 μm. An optical fiber and the core layer 22 were coupled to each other via a lens having a mode diameter of 5 μm. The refractive index of the core layer was 3.25, and that of n-InP was 3.17. The thickness of n-InP positioned on the core layer 22 was 3 μm (curve C1) and 1 μm (curve C2). Incident light in a Gaussian mode having a mode diameter of 5 μm was incident on the end face of the core layer 22, propagated in the tapered core layer 22, and a coupling loss at the time of coupling to a fundamental mode of the waveguide having a width of 2.5 μm was calculated by using a three-dimensional BPM (Beam Propagation Method). The width of the end face of the core layer 22 was changed in the range of 0.3 μm to 1.0 μm.

It is understood from FIG. 12 that the minimum coupling loss is −0.5 dB in the curve C1, whereas the minimum coupling loss increases to −1.3 dB in the curve C2.

The optical semiconductor integrated device 10 can be formed by using, for example, III-V group compound semiconductor. As the III-V group compound semiconductor, concretely, InP or GaAs can be used.

An embodiment of a preferred method of manufacturing the optical semiconductor integrated device 10 will be described with reference to the drawings.

Figure 14:
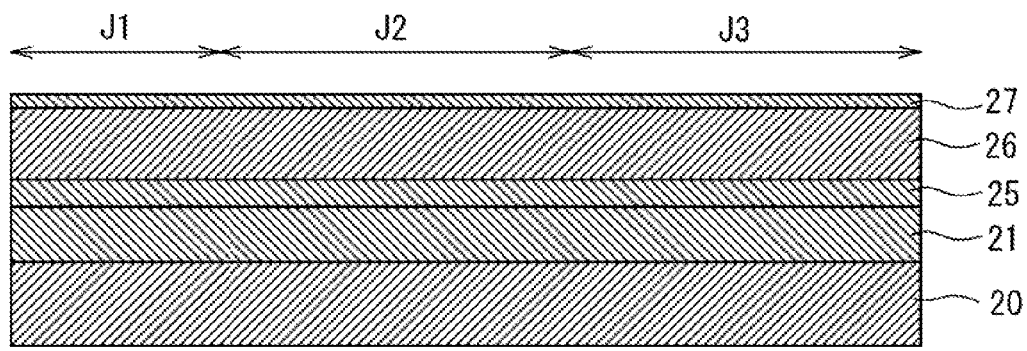
FIG. 14 is a diagram depicting a process (No. 1) of a first embodiment of a method of manufacturing an optical semiconductor integrated device disclosed in the specification.

As depicted in FIG. 14, the lower cladding layer 21, the light absorption layer 25, the third upper cladding layer 26, and the contact layer 27 are formed in order on the semiconductor substrate 20 with the (100) plane. In the embodiment, the crystalline layers are formed by using the MOVPE method. As the substrate 20, n-InP is used. The lower cladding layer 21 is formed by using n-InP having n-type conductivity, and its thickness is 1.0 μm. The light absorption layer 25 is formed by using undoped i-InGaAs and its thickness is 0.3 μm. The third upper cladding layer 26 is formed by using p-InP having p-type conductivity and its thickness is 0.9 μm.

The contact layer 27 is formed by using p-InGaAs and its thickness is 0.3 μm. In FIG. 14, a region in which the input unit 11 is to be formed is expressed as J1, a region in which the waveguide 12 is to be formed is expressed as J2, and a region in which the photodetector 13 is to be formed is expressed as J3.

Figure 15:
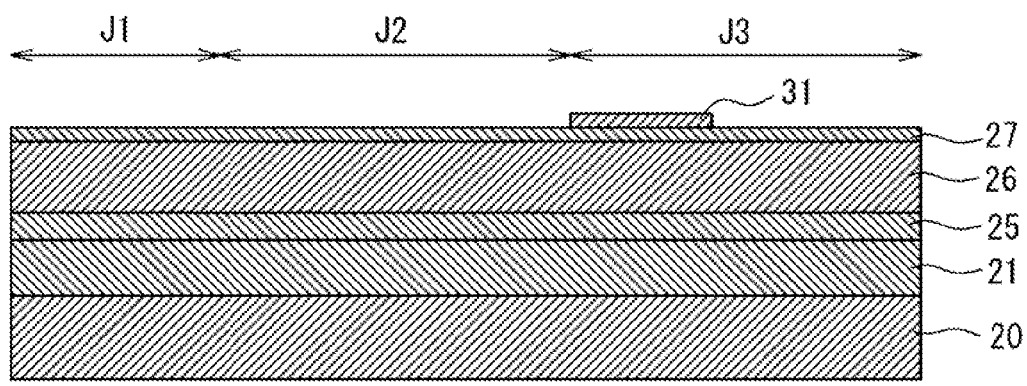
FIG. 15 is a diagram depicting a process (No. 2) of the first embodiment of the method of manufacturing an optical semiconductor integrated device disclosed in the specification.

As depicted in FIG. 15, a mask 31 is formed on a part in the contact layer 27, in which a region for detecting light of the region J3 is to be formed. The mask 31 can be formed by using the mask patterning technique. As the material of the mask 31, for example, silicon oxide can be used.

Figure 16:
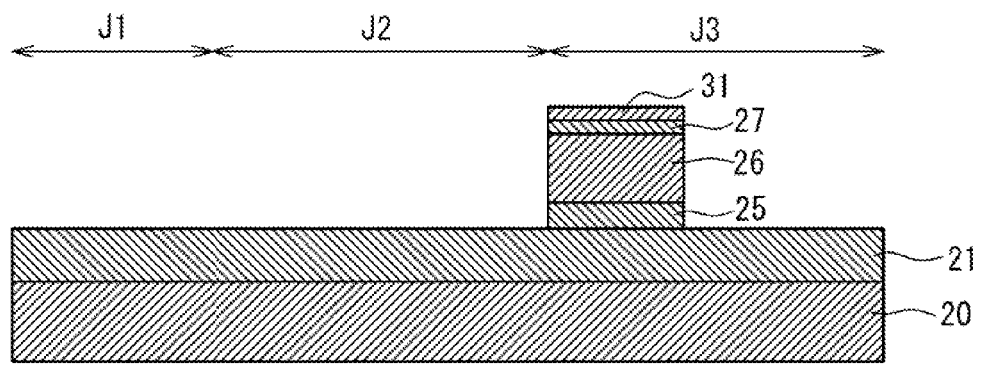
FIG. 16 is a diagram depicting a process (No. 3) of the first embodiment of the method of manufacturing an optical semiconductor integrated device disclosed in the specification.

As depicted in FIG. 16, using the mask 31, the contact layer 27, the third upper cladding layer 26, and the light absorption layer 25 are etched to expose the lower cladding layer 21 in the regions J1 and J2 and a part of the region J3. As an etching method, for example, wet etching can be used. Alternatively, dry etching such as plasma etching can be used.

Figure 17:
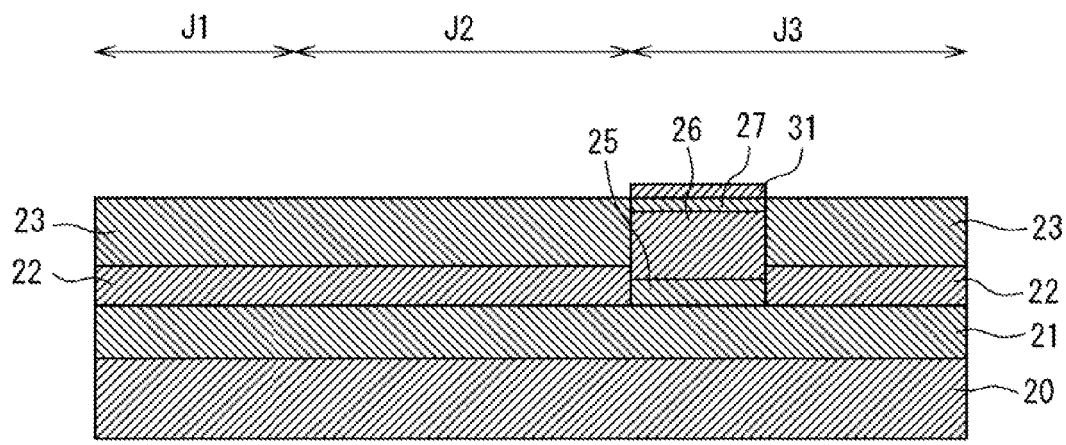
FIG. 17 is a diagram depicting a process (No. 4) of the first embodiment of the method of manufacturing an optical semiconductor integrated device disclosed in the specification.

As depicted in FIG. 17, in the regions J1 and J2 and a part of the region J3, the core layer 22 and the first upper cladding layer 23 are formed in order on the lower cladding layer 21. In the embodiment, the layers are formed by the MOVPE method. The core layer 22 is formed by using undoped i-InGaAsP and its thickness is 0.5 μm. The first upper cladding layer 23 is formed by using undoped i-InP and its thickness is 1.0 μm. The core layer 22 and the first upper cladding layer 23 are formed on the lower cladding layer 21, and the core layer 22 and the light absorption layer 25 are butt-joined. The core layer 22 and the first upper cladding layer 23 are not grown on the mask 31.

As depicted in FIGS. 18 to 22, the mesa unit 11d in the input unit 11, the mesa unit 12a in the waveguide 12, and the mesa unit 13a in the photodetector 13 are formed. Together with the formation of the mesa units 11d, 12a, and 13a, the pair of terraces 11b is formed while including a region V including the mesa unit 11d positioned in the direction of guiding light which propagates through the mesa unit 12a. The region V is a space sandwiched by the pair of opposed units 11c. The pair of terraces 11b is formed so that the interval of the terraces 11b is not constant but changes. In such a manner, the mesa unit 12a having a shape extending in one direction and the pair of terraces 11b sandwiching the region extending from the mesa unit 12a in the longitudinal direction of the mesa unit 12a toward the direction opposite to the mesa unit 12a are formed.

Figure 18:
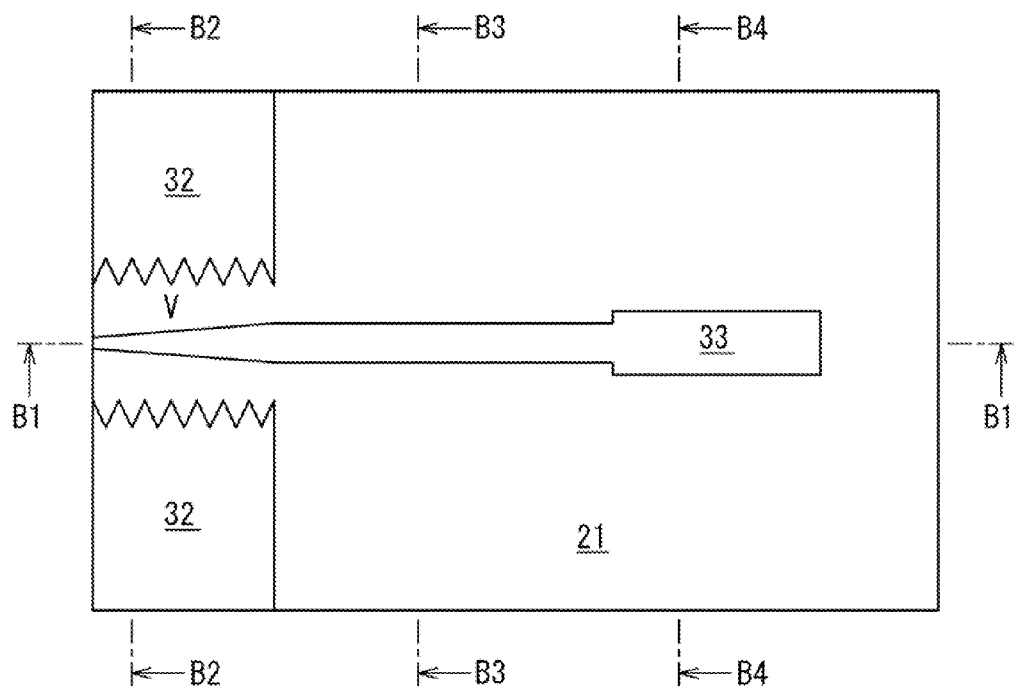
FIG. 18 is a diagram depicting a process (No. 5) of the first embodiment of the method of manufacturing an optical semiconductor integrated device disclosed in the specification.
Figure 19:
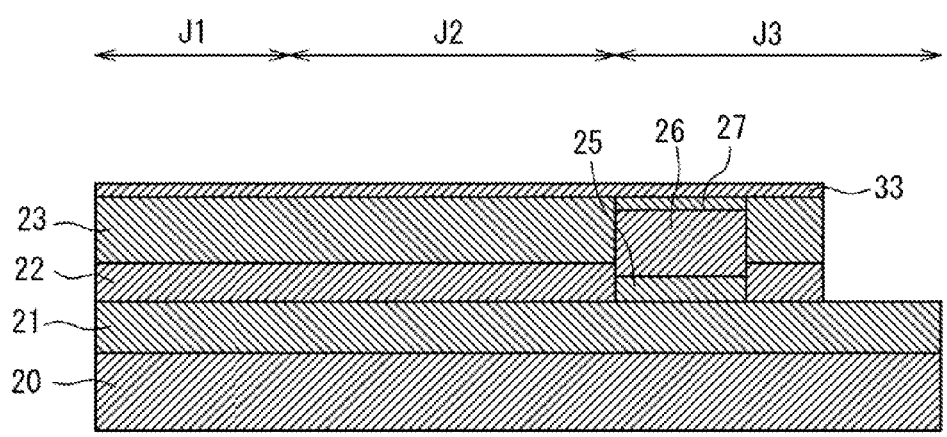
FIG. 19 is a cross section taken along line B1-B1 of FIG. 18.
Figure 20:
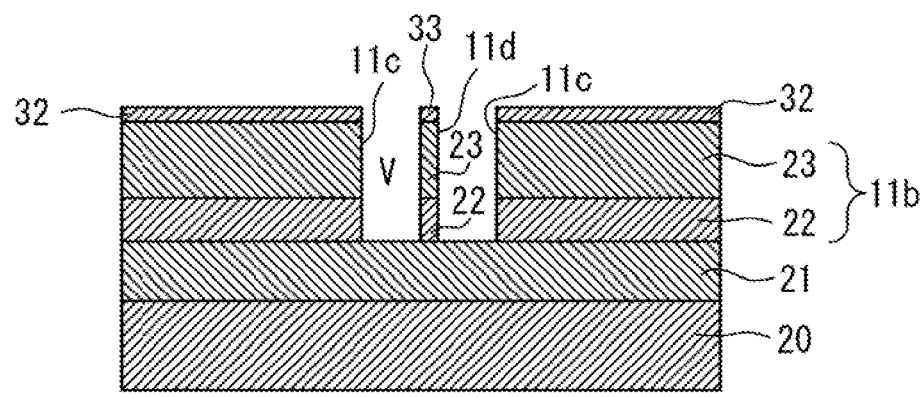
FIG. 20 is a cross section taken along line B2-B2 of FIG. 18.
Figure 21:
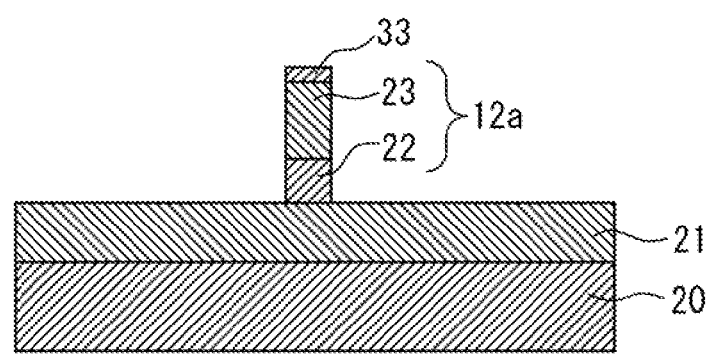
FIG. 21 is a cross section taken along line B3-B3 of FIG. 18.
Figure 22:
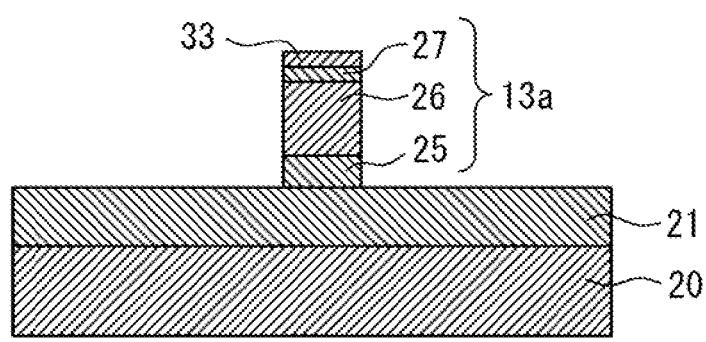
FIG. 22 is a cross section taken along line B4-B4 of FIG. 18.

FIG. 19 is a cross section taken along line B1-B1 of FIG. 18. FIG. 20 is a cross section taken along line B2-B2 of FIG. 18. FIG. 21 is a cross section taken along line B3-B3 of FIG. 18. FIG. 22 is a cross section taken along line B4-B4 of FIG. 18.

Concretely, a mask 32 is formed on the part of the first upper cladding layer 23 in which the pair of terraces 11b is formed, and a mask 33 is formed on the part of the first upper cladding layer 23 and the contact layer 27 in which the mesa units 11d, 12a, and 13a are formed. The mask 33 is formed so that the mesa unit 11d extends in the region V sandwiched by the pair of terraces 11b. As the material of forming the masks 32 and 33, for example, silicon oxide can be used.

The first upper cladding layer 23, the core layer 22, the contact layer 27, the third upper cladding layer 26, and the light absorption layer 25 are etched using the masks 32 and 33 to expose the lower cladding layer 21. At this time, a part of the surface of the lower cladding layer 21 may be also removed by etching. For example, the surface side of the lower cladding layer 21 may be etched by about 0.3 μm.

As described with reference to FIG. 3, the mask 32 includes the part having the orientation tilted to the [0-11] direction with respect to the [011] direction of the substrate 20, facing the part in which the region V is formed. Concretely, as described with reference to FIG. 3, the mask 32 includes parts each having orientation of 45° from the [011] direction toward the [0-11] direction and parts each having orientation of 135° from the [011] direction toward the [0-11] direction.

The pair of opposed units 11c formed by using such a mask 32 includes parts each having orientation tilted from the [011] direction toward the [0-11] direction. Concretely, as described with reference to FIG. 3, the opposed unit 11c is formed by alternately disposing the planes 30a and 30b and has a pattern of a triangular wave shape. The length in the [011] direction of the terrace 11b is 200 μm. The width in the [0-11] direction in the triangular-wave-shaped pattern in the opposed unit 11c is 3 μm. The shortest distance L between the opposed unit 11c and the mesa unit 11d is 5 μm. The relation between the shortest distance between the opposed units 11c and the thickness of the second burying layer 24 will be specifically described later.

Figure 23:
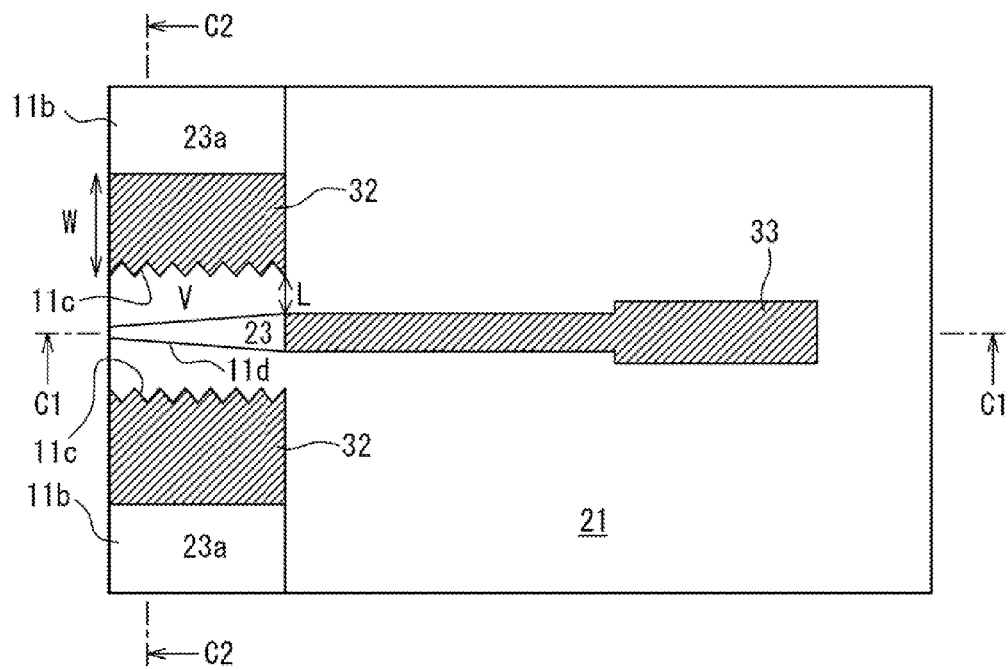
FIG. 23 is a diagram depicting a process (No. 6) of the first embodiment of the method of manufacturing an optical semiconductor integrated device disclosed in the specification.
Figure 24:
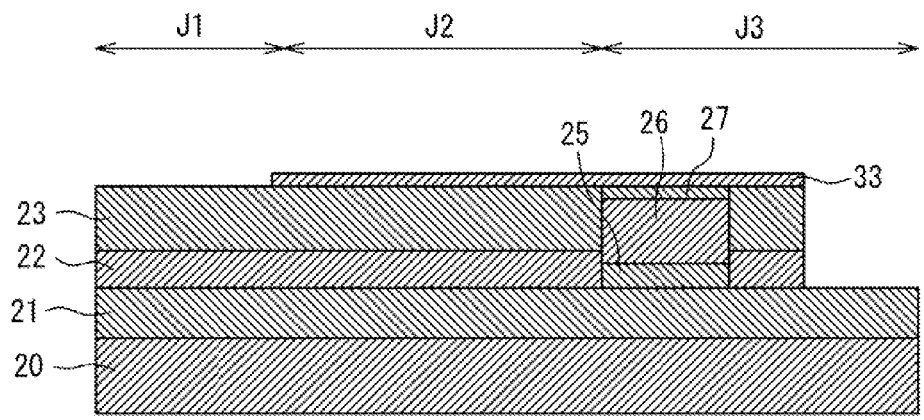
FIG. 24 is a cross section taken along line C1-C1 of FIG. 23.
Figure 25:
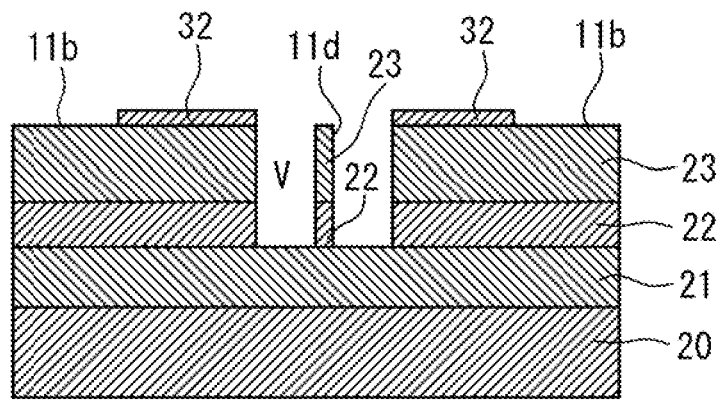
FIG. 25 is a cross section taken along line C2-C2 of FIG. 23.

As depicted in FIGS. 23 to 25, the mask 32 on the mesa unit 11d in the region sandwiched by the pair of terraces 11b is removed. The mask 32 is left on the region on the opposed unit 11c side in the pair of terraces 11b, and the mask 32 on the other region in the terraces 11b is removed. In other words, the mask 32 is removed except for the predetermined range on the opposed units 11c side of the pair of terraces 11b. In the embodiment, in each of the terrace units 11b, the mask 32 in the range having width W in the [0-11] direction from the opposed unit 11c side is left.

FIG. 24 is a cross section taken along line C1-C1 of FIG. 23. FIG. 25 is a cross section taken along line C2-C2 of FIG. 23.

The reason of leaving the mask 32 on the region on the opposed unit 11c side in each of the pair of the terraces 11b will be described. The semiconductor layer which forms the second burying layer 23 is not deposited on the part of the mask 32 but is diffused on the terrace 11b and deposited on the region V by selective growth. By leaving the mask 32, the material of the semiconductor layer which is deposited on the terraces 11b if there is no mask 32 is diffused to the part of the region V to increase the growth speed of the second burying layer 24. The relation between the width W of the mask 32 and the thickness of the second burying layer 24 will be described later.

The second burying layer 24 as semiconductor is grown so as to bury the mesa unit 11d to the inside in the region V between the pair of terraces 11b to form the spot size converting unit 11a, and the first burying layer 29 as semiconductor is formed so as to bury at least a part of both sides of the mesa units 12a and 13a. In the embodiment, the first burying layer 29 is formed so as to bury both sides of the mesa units 12a and 13a in the longitudinal direction of the entire mesa units 12a and 13a. The second burying layer 24 grows upward from each of the opposed units 11c. After that, the second burying layers 24 grown from the opposed units 11c grow toward the opposed sides and are combined. Consequently, the position of the upper end of the second burying layer 24 of the spot size converting unit 11a is higher than that of the upper end of the mesa unit 12a of the waveguide 12.

On the other hand, the first burying layer 29 is formed on both sides of the mesa units 12a and 13a at height almost equal to the position of the upper end of the mesa unit. The first burying layer 29 is formed so that its thickness is the same as that of the mesa units 12a and 13a in predetermined distance from both sides of the mesa units 12a and 13a and decreases after the predetermined distance from the mesa units 12a and 13a.

In the embodiment, the second burying layer 24 and the first burying layer 29 which are crystalline are formed by the MOVPE method. Prior to formation of the second burying layer 24 and the first burying layer 29 which are crystalline, a process of removing a layer damaged by dry etching may be performed by wet etching. The second burying layer 24 and the first burying layer 29 are formed simultaneously. The second burying layer 24 and the first burying layer 29 are formed by using InP to which Fe as semi-insulating semiconductor is added. The position of the upper end of the second burying layer 29 is higher than the position of the upper end of the mesa unit 12a in the waveguide 12 by 2 μm. The position of the upper end of the mesa unit 12a in the waveguide 12 coincides with that of the upper end of the mesa unit 13a in the photodetector 13.

By the MOVPE method of the embodiment, the second burying layer 24 and the first burying layer 29 are formed by using gas containing chlorine. Concretely, as process gas for forming the second burying layer 24 and the first burying layer 29, trimethyl indium, phosphine, and ferrocene are used as the materials for forming InP of semi-insulating semiconductor, and 1,2-dichloroethylene is used as the material of the gas containing chlorine.

After that, the masks 32 and 33 and the like are removed. By using the lithography technique and the etching technique, the first burying layer 29 in the part which is apart in the lateral direction from the mesa unit 13a in the photodetector 13 by 5 μm is removed, and the second electrode 28b is formed on the lower cladding layer 21. By using the metal evaporation or plating technique, the first electrode 28a is formed on the contact layer 27 of the mesa unit 13a in the photodetector 13. The part other than the first and second electrodes 28a and 28b is covered with a passivation film (not depicted) made of dielectric or the like. In such a manner, the optical semiconductor integrated device depicted in FIGS. 3 to 7 is obtained.

Next, the relation between the shortest distance between the pair of opposed units 11c and the thickness of a fourth upper cladding layer will be described with reference to the drawings. A fourth upper cladding layer 26a is a layer in which the first upper cladding layer 23 and the second burying layer 24 are stacked (refer to FIG. 5). In FIG. 5, the fourth upper cladding layer 26a expresses a part from the lower end of the first upper cladding layer 23 to the upper end of the second burying layer 24.

Figure 26:
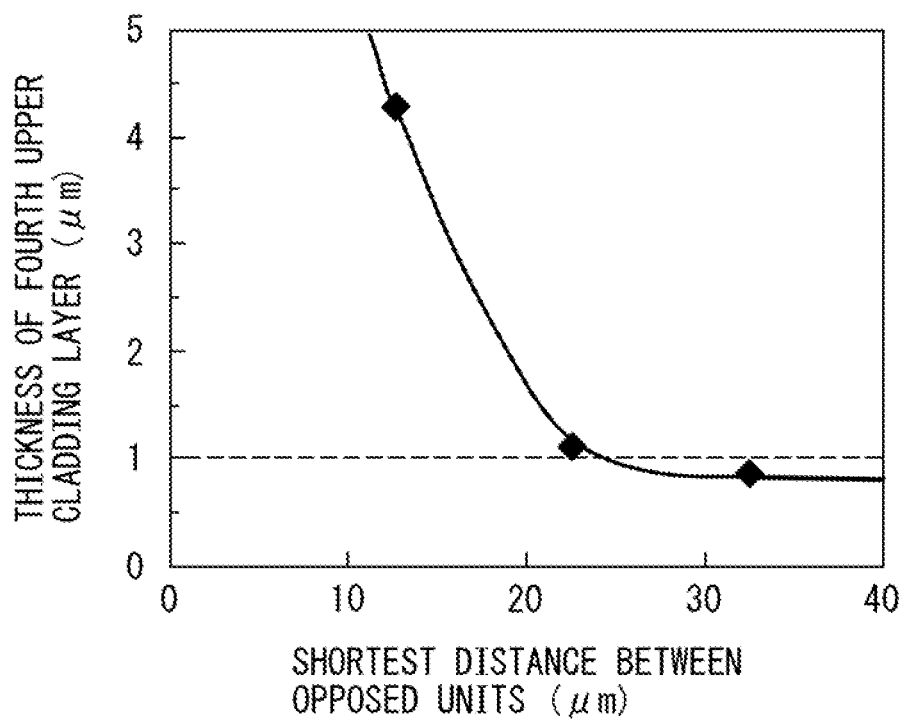
FIG. 26 is a diagram depicting the relation between shortest distance between opposed units and thickness of a fourth upper cladding layer.

FIG. 26 is a diagram depicting the relation between shortest distance between the pair of opposed units 11c and thickness of the fourth upper cladding layer upper than the core layer.

Concretely, FIG. 26 depicts a result of examination of the thickness of the fourth upper cladding layer 26a upper than the core layer 22 while changing the shortest distance between the pair of terraces 11b.

Data in FIG. 26 was measured by the following experiment. The length in the [011] direction of the terrace 11b was 400 μm. The width in the [0-11] direction of the triangle-wave-shaped pattern in the opposed unit 11c was 3 μm. In the terrace 11b, the mask 32 in the range of 100 μm as the width W from the opposed unit 11c side was left. The mask on the mesa unit 11d in the region sandwiched by the pair of terraces 11b was removed. As the process of removing a layer damaged by dry etching, the side faces and the bottom face of the mesa unit were etched by 0.2 μm by wet etching. Since the mesa unit 11d in the region sandwiched by the pair of opposed units 11c was not covered with a mask at that time, the first upper cladding layer 23 was also etched. The thickness of the first upper cladding layer 23 after the etching was 0.8 μm. By using the MOVPE method, the second burying layer 24 which is crystalline was formed. As the process gas for forming the second burying layer 24, trimethyl indium, phosphine, and ferrocene were used as the materials for forming InP of semi-insulating semiconductor, and 1,2-dichloroethylene was used as the material of the gas containing chlorine.

It is understood from FIG. 26 that as the shortest distance between the pair of opposed units 11c decreases, the thickness of the fourth upper cladding layer upper than the core layer 22 increases. In particular, the shortest distance between the pair of opposed units 11c in the pair of terraces 11b is preferably 20 μm or less from the viewpoint of increasing the thickness of the fourth upper cladding layer 26a.

By changing the shortest distance between the pair of opposed units 11c, the growth speed of the second burying layer 24 can be adjusted.

The relation between the shortest distance between the pair of opposed units 11c and the thickness of the fourth upper cladding layer 26a has been described above.

The relation between the width W (refer to FIG. 23) of the mask 32 on the terrace 11b and the thickness of the fourth upper cladding layer 26a will now be described with reference to the drawings.

Figure 27:
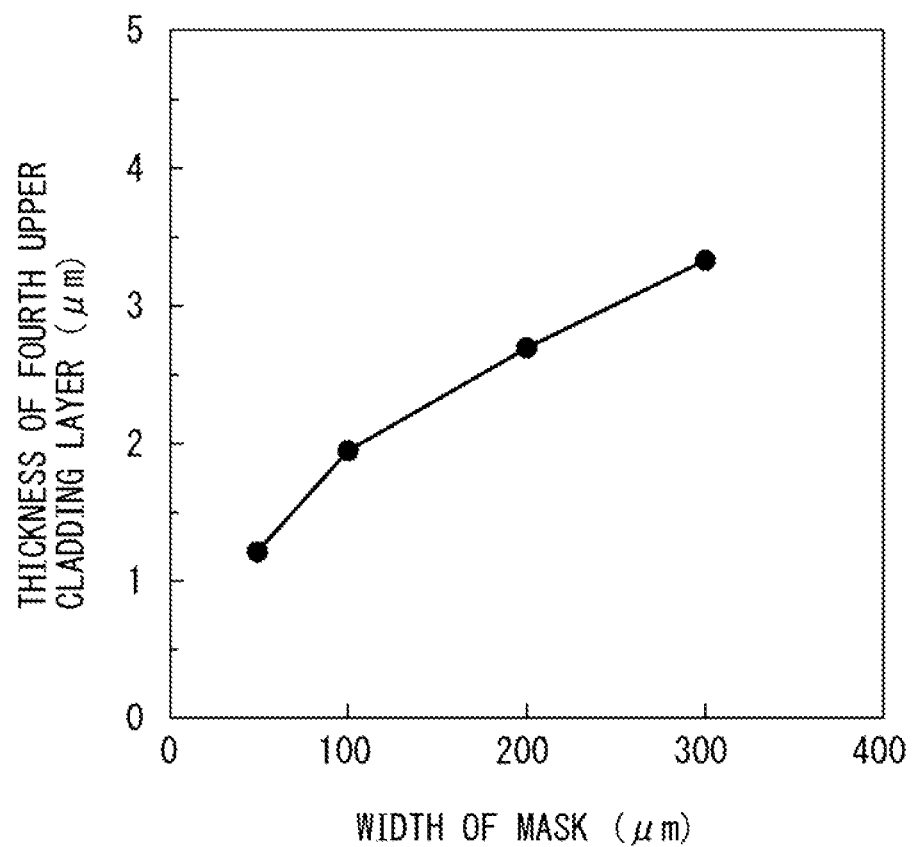
FIG. 27 is a diagram depicting the relation between width of a mask on a terrace and thickness of the fourth upper cladding layer.

FIG. 27 is a diagram depicting the relation between width of the mask on the terrace 11b and thickness of the fourth upper cladding layer 26a.

FIG. 27 depicts a result of examination of the thickness of the fourth upper cladding layer 26a upper than the core layer 22 when the second burying layer 24 is formed while changing the width W of the mask on the terrace 11b (refer to FIG. 23).

The data depicted in FIG. 27 was measured by the following experiment. The opposed unit 11c of the terrace 11b has a shape similar to that described with reference to FIGS. 23 and 25. The length in the [011] direction of the terrace 11b was 200 μm. The width in the [0-11] direction of the triangular-shaped pattern in the opposed unit 11c was 3 μm. The shortest distance between the pair of opposed units 11c was 12.5 μm. The mask 32 on the mesa unit 11d in the region sandwiched by the pair of opposed units 11c was removed. As a process of removing a layer damaged by dry etching, the side faces and the bottom face of the mesa unit 11d were etched by 0.2 μm by wet etching. Since the surface of the mesa unit 11d in the region sandwiched by the pair of opposed units 11c is not covered with the mask, the first upper cladding layer 23 is also etched. The thickness of the first upper cladding layer 23 after the etching was 0.8 μm. By using the MOVPE method, the second burying layer 24 which is crystalline was formed. As process gas for forming the second burying layer 24, trimethyl indium, phosphine, and ferrocene as the materials of forming semi-insulating Inp and 1,2-dichloroethylene as an organochlorine material were used.

As depicted in FIG. 27, as the width W of the mask on the terrace 11b increases, the thickness of the fourth upper cladding layer 26a increases. It is believed that as the width W of the mask increases, by selective growth effect, the amount of the material which is diffused onto the mask 32 and reaches the region V increases, and the thickness of the second burying layer 24 increases.

As described above, when the width W of the mask on the terrace 11b is changed, the growth speed of the second burying layer 24 can be adjusted.

When the width W of the mask on the terrace 11b becomes larger than the diffusion length of the material which is diffused on the terrace 11b, the increase rate of thickness of the second burying layer 24 is expected to decrease.

In the optical semiconductor integrated device 10 of the embodiment, the position of the upper end of the second burying layer 24 is higher than that of the upper end of the mesa unit 12a in the waveguide 12. Therefore, the light coupling loss caused by the difference between the spot size of light which is incident on the optical semiconductor integrated device 10 from the outside and the spot size of the light of the waveguide 12 is suppressed.

In the method of manufacturing the optical semiconductor integrated device of the embodiment, in the process of burying a mesa unit by adding gas containing chlorine to process gas for forming the first and second burying layers 29 and 24, the second burying layer 24 for burying both sides and the top side of the mesa unit 11d in the input unit 11 can be formed so that its upper position is higher than the position of the upper end of the mesa unit 12a in the waveguide 12. Therefore, the optical semiconductor integrated device 10 in which the light coupling loss caused by the difference between the spot sizes is suppressed is obtained.

On the other hand, when the mask on the mesa unit in the spot size converting unit is removed and, after that, the burying layer for burying the mesa unit is formed by using process gas which contains no chlorine, although the cladding layer can be formed on the mesa unit in the spot size converting unit, the orientation in the longitudinal direction of the mesa unit in the spot size converting unit is limited to the [011] direction, the longitudinal direction of the mesa unit is limited to a layout that it extends to the cleave position of the device, and a problem occurs that flexibility of designing is limited. By using the method of manufacturing the optical semiconductor integrated device of the embodiment, such a problem is solved.

In the foregoing embodiment, the orientation in the longitudinal direction of the mesa unit 11d including the core layer 22 in the input unit 11 and the mesa unit 12a in the waveguide 12 coincides the [011] direction. However, the orientation in the longitudinal direction of the mesa unit 11d including the core layer 22 and the mesa unit 12a in the waveguide 12 may have a [011] direction component and a [0-11] direction component. In other words, the mesa unit 11d and/or the mesa unit 12a may extend in a direction having a directional component of a tilt from the [011] direction toward the [0-11] direction.

Although the orientation in the longitudinal direction of the mesa unit 13a in the photodetector 13 coincides with the [011] direction in the foregoing embodiment, the orientation in the longitudinal direction of the mesa unit 12a may have a [011] direction component and a [0-11] direction component.

Hereinafter, a second embodiment of the optical semiconductor integrated device will be described with reference to FIGS. 28 to 33. With respect to points which are not described in the second embodiment, the detailed description in the first embodiment is properly applied.

[b] Second Embodiment

Figure 28:
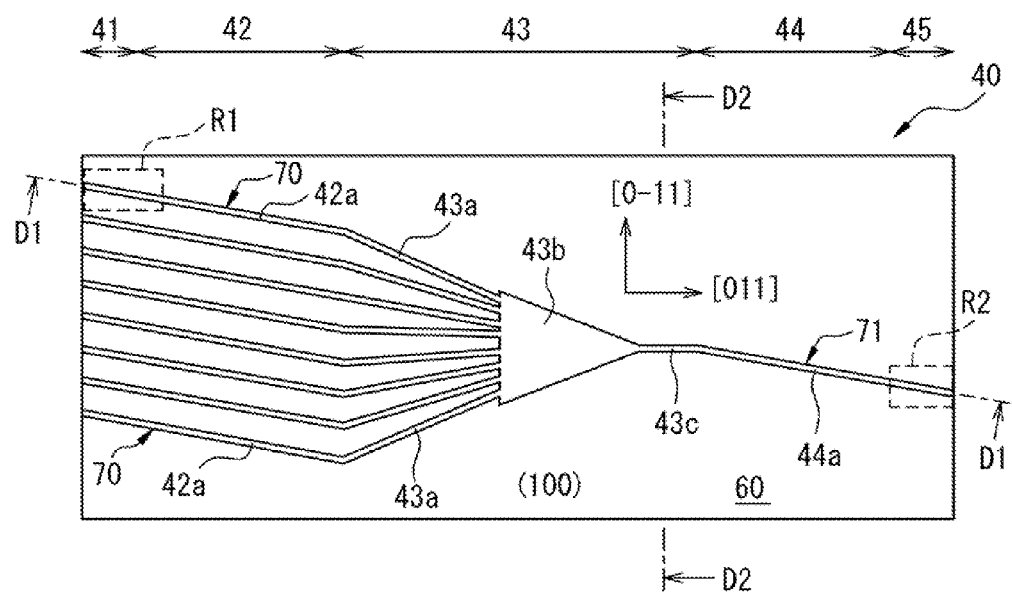
FIG. 28 is a diagram depicting a second embodiment of an optical semiconductor integrated device disclosed in the specification.
Figure 31A:
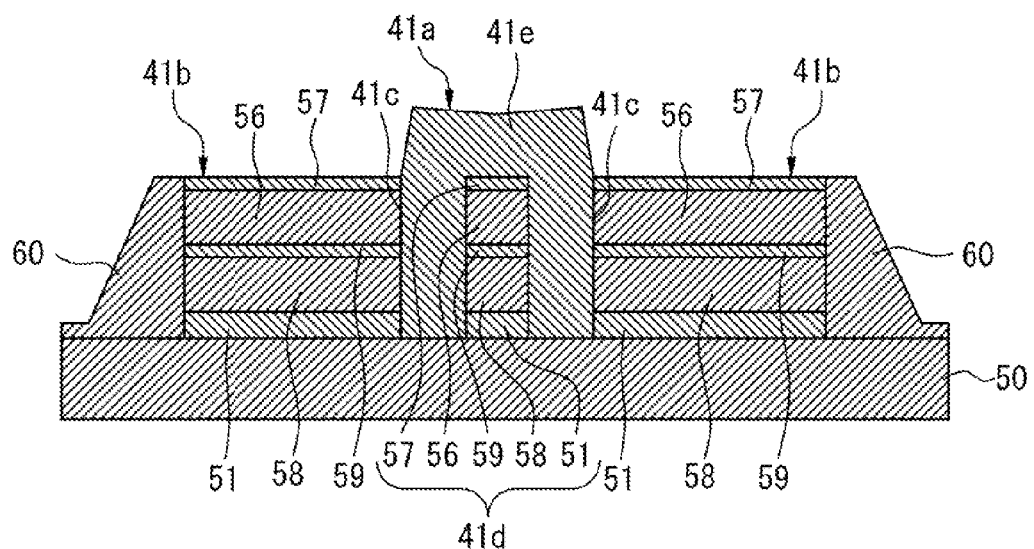
FIG. 31A is an enlarged cross section taken along line E1-E1 of FIG. 30A.
Figure 31B:
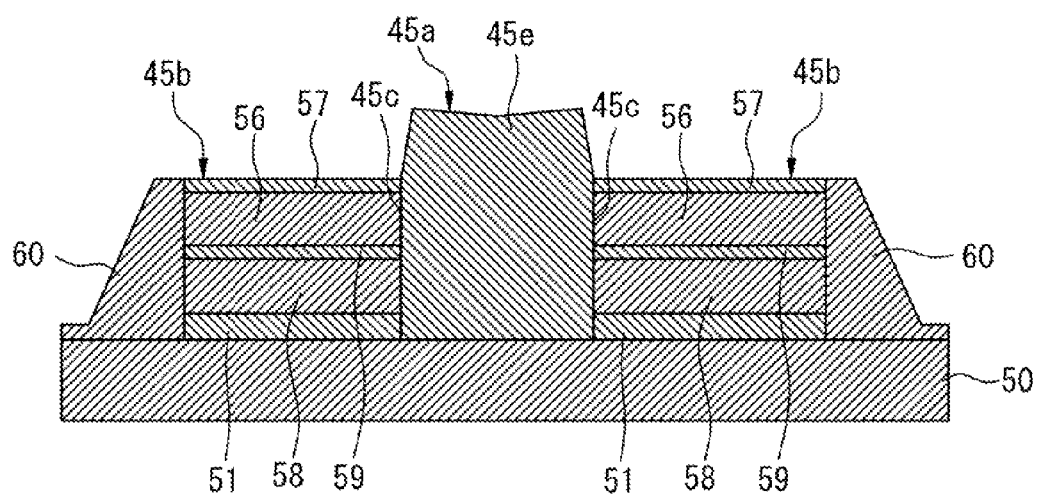
FIG. 31B is an enlarged cross section taken along line E3-E3 of FIG. 30B.
Figure 32:
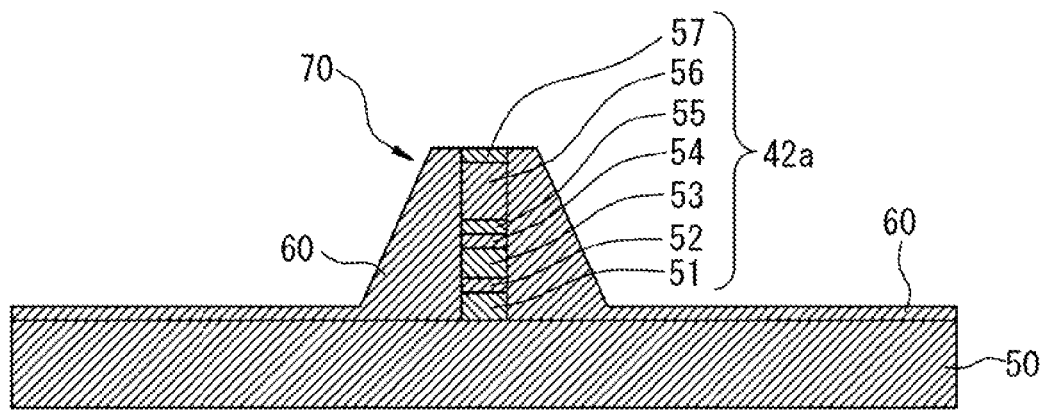
FIG. 32 is an enlarged cross section taken along line E2-E2 of FIG. 30A.
Figure 33:
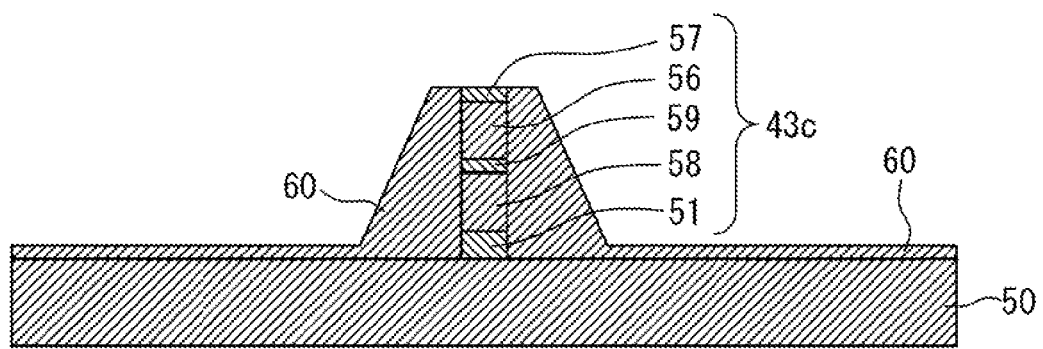
FIG. 33 is an enlarged cross section taken along line D2-D2 of FIG. 28.

FIG. 28 is a diagram depicting the second embodiment of the optical semiconductor integrated device disclosed in the specification. FIG. 29 is an enlarged cross section taken along line D1-D1 of FIG. 28. FIG. 30A is an enlarged diagram of a region R1 in FIG. 28. FIG. 30B is an enlarged diagram of a region R2 in FIG. 28. FIG. 31A is an enlarged cross section taken along line E1-E1 of FIG. 30A. FIG. 31B is an enlarged cross section taken along line E3-E3 of FIG. 30B. FIG. 32 is an enlarged cross section taken along line E2-E2 of FIG. 30A. FIG. 33 is an enlarged cross section taken along line D2-D2 of FIG. 28.

An optical semiconductor integrated device 40 is a semiconductor optical switch of 8×1 channels. The optical semiconductor integrated device 40 includes eight input channels in one of end faces and includes one output channel in the other end face.

The optical semiconductor integrated device 40 includes an input unit 41 which converts the spot size of light from the outside and receives the resultant light. The input unit 41 includes eight input channels. Each of the input channels receives light propagating through an optical fiber or the like from the outside and converts the spot size of the light to smaller size.

The optical semiconductor integrated device 40 includes a first light amplifying unit 42 which amplifies the light received from the input unit 41. The first light amplifying unit 42 includes optical waveguides 70 which are optically connected to the eight input channels of the input unit 41. The optical waveguide 70 includes a semiconductor burying layer 60 for burying a mesa unit 42a and both sides of the mesa unit 42a. The mesa unit 42a to which current is not supplied absorbs light. Therefore, in the first light amplifying unit 42, by supplying current only to the mesa unit 42a in a channel in which light is propagated out of the eight mesa units 42a, only light supplied to the mesa unit 42a in the channel to which current is supplied is amplified and propagated.

As depicted in FIGS. 28 and 30A, the mesa unit 42a in the first light amplifying unit 42 extends in an orientation having the [011] direction component and the [0-11] direction component of a substrate 50. In other words, the orientation in the longitudinal direction of the mesa unit 42a has the [011] direction component of the substrate 50 and also the [0-11] direction component. Concretely, the orientation in the longitudinal direction of the mesa unit 42a in the first light amplifying unit 42 tilts at −10° toward the [0-11] direction from the [011] direction of the substrate 50.

The optical semiconductor integrated device 40 includes an optical coupling unit 43 which couples the light propagating through the mesa units 42a in the eight channels of the first light amplifying unit 42 and outputs coupled light. The optical coupling unit 43 includes an optical waveguide 43a which is connected to the mesa unit 42a in each channel in the first optical amplifying unit 42 and propagates light, a coupler body 43b which couples the light propagating through the optical waveguides 43a and outputs the coupled light, and an optical waveguide 43c propagating the light input from the coupler body 43b. The optical waveguide 43a, the coupler body 43b, and the optical waveguide 43c have a similar mesa structure.

As depicted in FIG. 28, the optical waveguide 43a of the optical coupling unit 43 extends in a direction having a [011] direction component and a [0-11] direction component. In other words, the orientation in the longitudinal direction of the optical waveguide 43a has a [011] direction component and a [0-11] direction component. The input side of the optical coupling unit 43 has the [0-11] direction.

The optical semiconductor integrated device 40 includes a second optical amplifying unit 44 which amplifies light entered from the optical waveguides 43a of the optical coupling unit 43. The second optical amplifying unit 44 includes an optical waveguide 71 connected to the optical waveguide 43c. The optical waveguide 71 includes a semiconductor burying layer 60 which buries a mesa unit 44a and both sides of the mesa unit 44a. Current is always supplied to the mesa unit 44a, and the mesa unit 44a amplifies the light entered from the optical waveguide 43c and outputs the amplified light. The optical waveguide 71 of the second optical amplifying unit 44 is optically connected to an output unit 45.

As depicted in FIG. 30B, the optical waveguide 71 of the second optical amplifying unit 44 extends in a direction having a [011] direction component and a [0-11] direction component. In other words, the orientation in the longitudinal direction of the mesa unit 44a has a [011] direction component and a [0-11] direction component. Concretely, the orientation in the longitudinal direction of the mesa unit 44a in the second optical amplifying unit 44 tilts at −10° from the [011] direction toward the [0-11] direction.

Further, the optical semiconductor integrated device 40 includes the output unit 45 which converts the spot size of light entered from the second optical amplifying unit 44 to larger size and outputs the resultant light to the outside.

Next, a concrete structure of the optical semiconductor integrated device 40 will be further described.

As depicted in FIG. 29, the optical semiconductor integrated device 40 includes the semiconductor substrate 50 with the (100) plane. In the optical semiconductor integrated device 40, the input unit 41, the first optical amplifying unit 42, the optical coupling unit 43, the second optical amplifying unit 44, and the output unit 45 are disposed on the (100) plane of the substrate 50.

First, the structure of the input unit 41 will be described.

As depicted in FIG. 30A, the input unit 41 includes a first spot size converting unit 41a optically coupled to the mesa unit 42a in the first optical amplifying unit 42 and a pair of terraces 41b opposed to each other while sandwiching the first spot size converting unit 41a.

The first spot size converting unit 41a includes a mesa unit 41d in which the mesa unit 42a of the first optical amplifying unit 42 extends in the first spot size converting unit 41a, and a burying semiconductor layer 41e which buries the mesa unit 41d. The orientation in the longitudinal direction of the mesa unit 41d coincides with that in the longitudinal direction of the mesa unit 42a in the first optical amplifying unit 42. The input end of the mesa unit 42a in the first optical amplifying unit 42 has the [0-11] direction.

Each of opposed units 41c opposed to each other while sandwiching the first spot size converting unit 41a in the pair of terraces 41b includes a part whose orientation tilts toward the [011] direction.

In the example depicted in FIG. 30A, the opposed unit 41c includes a plane 61a having an orientation of 55° from the [011] direction toward the [0-11] direction and a plane 61b having an orientation of 145° from the [011] direction toward the [0-11] direction. The opposed unit 41c is formed by alternately disposing the planes 61a and 61b and includes a pattern of a triangular wave shape. The projection positions and the recessed positions in the pattern of the triangular wave shape coincide between the opposed units 41c.

As depicted in FIGS. 29 and 31A, the first spot size converting unit 41a is disposed on the substrate 50. In the mesa unit 41d of the first spot size converting unit 41a, a lower cladding layer 51 is disposed on the substrate 50, a core layer 58 is disposed on the lower cladding layer 51, and a third upper cladding layer 59 is disposed on the core layer 58. A second upper cladding layer 56 is disposed on the third upper cladding layer 59, and a contact layer 57 is disposed on the second upper cladding layer 56. In the core layer 58, the end part on the optical waveguide 70 side is wider than that on the side opposite to the optical waveguide 70. Concretely, the mesa unit 41d including the core layer 58 extends in the first spot size converting unit 41a while being narrowed from the optical waveguide 70 side toward the direction opposite to the optical waveguide 70 side of the first spot size converting unit 41a. The mesa unit 41d does not reach the end part in the direction opposite to the optical waveguide 70 side of the first spot size converting unit 41a and extends to a position in the first spot size converting unit 41a.

In the terrace 41b, the lower cladding layer 51 is disposed on the substrate 50, the core layer 58 is disposed on the lower cladding layer 51, and the third upper cladding layer 59 is disposed on the core layer 58. The second upper cladding layer 56 is disposed on the third upper cladding layer 59, and the contact layer 57 is disposed on the second upper cladding layer 56.

The side faces of the terrace 41b are buried with the burying layer 60. The burying layer 60 is formed in the same thickness as that of the terrace 41b in predetermined distance from both sides of the terrace 41b, and the thickness of the burying layer 60 decreases after the predetermined distance from the terrace 41b. The burying layer 60 is not formed on the terrace 41b.

As depicted in FIGS. 30B and 31B, the output unit 45 has a second spot size converting unit 45a and a pair of terraces 45b opposed to each other while sandwiching the second spot size converting unit 45a. The second spot size converting unit 45a is formed by a burying semiconductor layer 45e buried between the pair of terraces 45b. Each of the opposed units 45c opposed to each other while sandwiching the second spot size converting unit 45a in the pair of terraces 45b includes a part tilted toward the [011] direction. The structure is similar to the input unit 41. On the other hand, a mesa unit including a core layer is not disposed in the second spot size converting unit 45a. In other words, in the second spot size converting unit 45a, a core layer for confining and propagating light is not disposed. The light supplied from the second optical amplifying unit 44 to the second spot size converting unit 45a freely propagates in the second spot size converting unit 45a, its spot size is largely converted, and the resultant light is output to the outside.

Next, the reason why a mesa unit including a core layer is not disposed in the second spot size converting unit 45a will be described. The reason is to reduce return light of light which is reflected by the end face of the second spot size converting unit 45a and enters again the second optical amplifying unit 44. When the second spot size converting unit 45a includes a core layer, return light generated by reflection at the end face of the second spot size converting unit 45a increases. Although reflection of light by the end face of the second spot size converting unit 45a occurs even if there is no core layer, the reflected light propagates toward the second optical amplifying unit 44 while being expanded. Consequently, return light to the second optical amplifying unit 44 can be reduced.

The output unit 45 has a structure similar to that of the input unit 41 except for the number of mesa units and the number of channels. Therefore, description on the input unit 41 is properly applied to the output unit 45.

Next, the structure of the first optical amplifying unit 42 will be described.

As depicted in FIG. 32, in the mesa unit 42a of the first optical amplifying unit 42, the lower cladding layer 51 is disposed on the substrate 50, and a lower SCH (Separate Confinement Heterostructure) layer 52 is disposed on the lower cladding layer 51. An active layer 53 is disposed on the lower SCH layer 52, an upper SCH layer 54 is disposed on the active layer 53, and a first upper cladding layer 55 is disposed on the upper SCH layer 54. The second upper cladding layer 56 is disposed on the first upper cladding layer 55, and the contact layer 57 is disposed on the second upper cladding layer 56.

Both sides of the mesa unit 42a are buried with the burying layer 60. The burying layer 60 is formed in the same thickness as that of the mesa unit 42a in predetermined distance on both sides of the mesa unit 42a, and the thickness decreases after the predetermined distance from the mesa unit 42a. On the mesa unit 42a, the burying layer 60 is not formed. By the mesa unit 42a and the burying layer 60, the optical waveguide 70 is formed.

Light propagated through the first spot size converting unit 41a in the input unit 41 which converts the spot size of light from the outside is propagated to the active layer 53 of the mesa unit 42a in the first optical amplifying unit 42.

In the mesa unit 42a, the active layer 53 to which current is supplied by a not-depicted electrode amplifies input light and outputs the amplified light. On the other hand, in the active layer 53 in the mesa unit 42a to which no current is supplied, input light is absorbed and is not output.

The first optical amplifying unit 42 supplies current to any one or more of the eight mesa units 42a, so that only light propagating through a channel to which current is supplied is output to the optical coupling unit 43.

The second optical amplifying unit 44 has a structure similar to that of the first optical amplifying unit 42 except for the number of channels. Therefore, description on the first optical amplifying unit 42 is properly also applied to the second optical amplifying unit 44.

Next, the structure of the optical coupling unit 43 will be described.

The eight optical waveguides 43a, the coupler body 43b, and one optical waveguide 43c in the optical coupling unit 43 have similar mesa structures. Using the optical waveguide 43c as an example, the structure of the optical waveguide 43c will be described.

As depicted in FIG. 33, in the optical waveguide 43c, the lower cladding layer 51 is disposed on the substrate 50, the core layer 58 is disposed on the lower cladding layer 51, and the third upper cladding layer 59 is disposed on the core layer 58. The second upper cladding layer 56 is disposed on the third upper cladding layer 59, and the contact layer 57 is disposed on the second upper cladding layer 56.

Both sides of the optical waveguide 43c are buried with the burying layer 60. The burying layer 60 is formed in the same thickness as that of the optical waveguide 43c in predetermined distance on both sides of the optical waveguide 43c, and the thickness decreases after the predetermined distance from the optical waveguide 43c. On the optical waveguide 43c, the burying layer 60 is not formed.

Light propagated through the mesa unit 42a in the first optical amplifying unit 42 is supplied to the core layer 58 in the optical waveguide 43a. To the core layer 58 in the coupler body 43b, light is supplied from any one or more of the eight optical waveguides 43a. The input light is output to the core layer 58 in the optical waveguide 43c. As the coupler body 43b, for example, FFC (Field Flattened Coupler) or a multimode interference coupler can be used.

An embodiment of a preferred method of manufacturing the optical semiconductor integrated device 40 will be described with reference to the drawings.

First, the lower cladding layer 51, the lower SCH layer 52, the active layer 53, the upper SCH layer 54, and the first upper cladding layer 55 are formed in order on the semiconductor substrate 50 with the (100) plane. In the embodiment, the layers of semiconductor crystal are formed by using the MOVPE method. N—InP is used as the substrate 50. The lower cladding layer 51 is formed by using n-InP having n-type conductivity, and its thickness is 0.3 μm. The lower SCH layer 52 is formed using n-InGaAsP having composition wavelength of 1.1 μm and n-type conductivity, and its thickness is 0.03 μm.

As the active layer 53, a quantum well structure is used. The quantum well structure is formed by using an undoped i-InGaAsP well layer and an undoped i-InGaAsP barrier layer. The i-InGaAsP well layer has composition wavelength of 1.55 µm and a thickness of 5 nm. The i-InGaAsP barrier layer has a composition wavelength of 1.2 µm and a thickness of 6 nm. The number of layers stacked in the quantum well structure is four. The upper SCH layer 54 is formed by using p-InGaAsP having a composition wavelength of 1.1 µm and p-type conductivity, and its thickness is 0.03 µm. The first upper cladding layer 55 is formed by using p-InP and its thickness is 0.05 µm.

In FIG. 34, a region in which the input unit 41 is to be formed is expressed as K1, a region in which the first optical amplifying unit 42 is to be formed is expressed as K2, a region in which the optical coupling unit 43 is to be formed is expressed as K3, a region in which the second optical amplifying unit 44 is to be formed is expressed as K4, and a region in which the output unit 45 is to be formed is expressed as K5.

As depicted in FIG. 35, a mask 62 is formed on the first upper cladding layer 55 in each of the regions K2 and K4. The mask 62 can be formed by using the mask patterning technique. As the material of the mask 62, for example, silicon oxide can be used. Using the mask 62, the first upper cladding layer 55, the upper SCH layer 54, the active layer 53, and the lower SCH layer 52 are etched to expose the lower cladding layer 51 in the regions K1, K3, and K5. As an etching method, for example, wet etching or dry etching such as plasma etching can be used.

As depicted in FIG. 36, in the regions K1, K3, and K5, the core layer 58 and the third upper cladding layer 59 are formed in order on the lower cladding layer 51. In the embodiment, the layers of semiconductor crystal are formed by the MOVPE method. The core layer 58 is formed by using i-InGaAsP having a composition wavelength of 1.3 µm and its thickness is 0.11 µm. The third upper cladding layer 59 is formed by using i-InP and its thickness is 0.05 µm. The core layer 58 and the third upper cladding layer 59 are formed on the lower cladding layer 51 by selective growth, and are not formed on the mask 62. The core layer 58 and the active layer 53 are butt-joined. After that, the mask 62 is removed.

As depicted in FIG. 37, the second upper cladding layer 56 and the contact layer 57 are formed in order in the regions K1 to K5. In the embodiment, the layers of semiconductor crystal are formed by using the MOVPE method. The second upper cladding layer 56 is formed by using p-InP and its thickness is 1.95 µm. The contact layer 57 is formed by using p-InGaAs and its thickness is 0.3 µm.

Figure 39A:
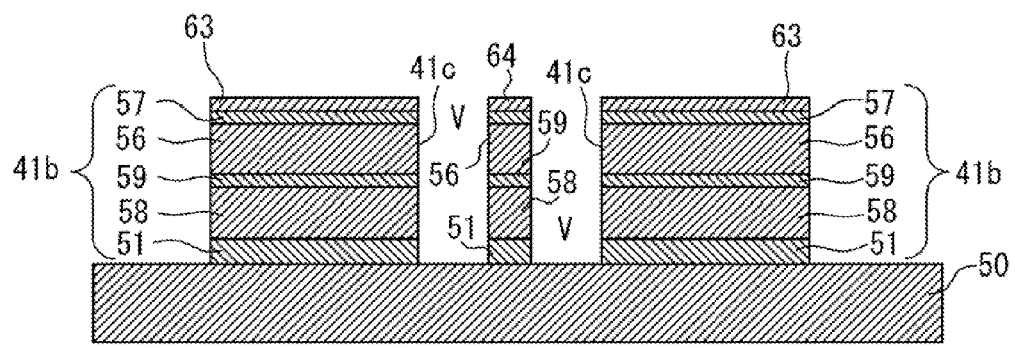
FIG. 39A is an enlarged cross section taken along line F1-F1 of FIG. 38.
Figure 39B:
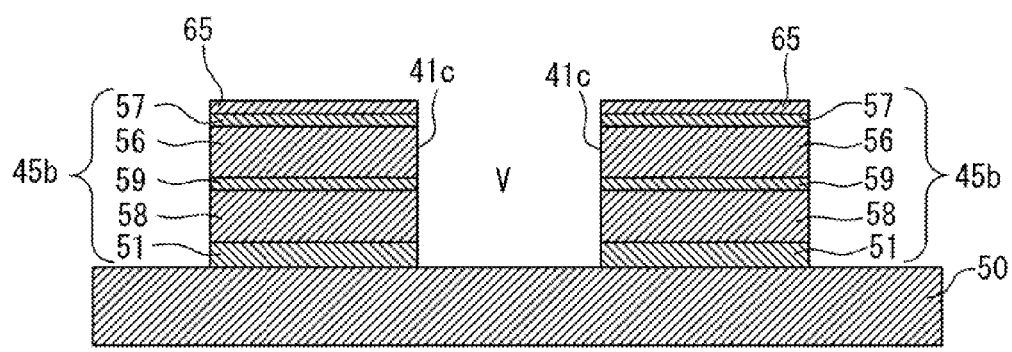
FIG. 39B is an enlarged cross section taken along line F3-F3 of FIG. 38.
Figure 40:
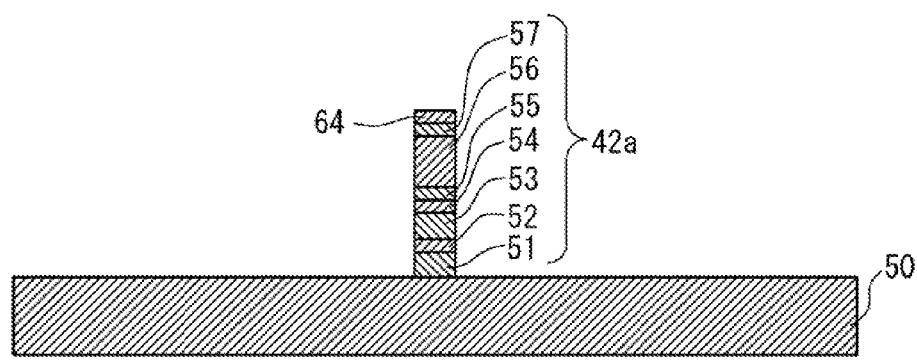
FIG. 40 is an enlarged cross section taken along line F2-F2 of FIG. 38A.

As depicted in FIGS. 38 to 40, the mesa unit 42a in the first optical amplifying unit 42 and the pair of terraces 41b in the input unit 41 sandwiching the region V positioned in the direction of guiding light which propagates through the mesa unit 42a are formed. The pair of terraces 41b is formed so that the interval of the terraces 41b is not constant but changes. Together with the mesa unit 42a and the pair of terraces 41b, the optical waveguide 43a, the coupler body 43b, and the optical waveguide 43c of the optical coupling unit 43, the mesa unit 44a in the second optical amplifying unit 44, and the pair of terraces in the output unit 45 are formed. In such a manner, the mesa unit 42a having a shape extending in one direction and the pair of terraces 41b sandwiching the region extending from the mesa unit 42a in the longitudinal direction of the mesa unit 42a toward the direction opposite to the mesa unit 42a are formed.

Figure 38A:
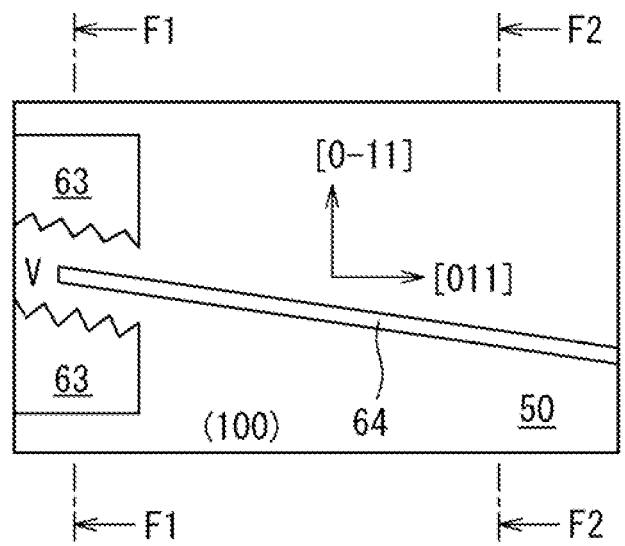
FIG. 38A is a diagram depicting a process (No. 5) of the second embodiment of the method of manufacturing an optical semiconductor integrated device disclosed in the specification.
Figure 38B:
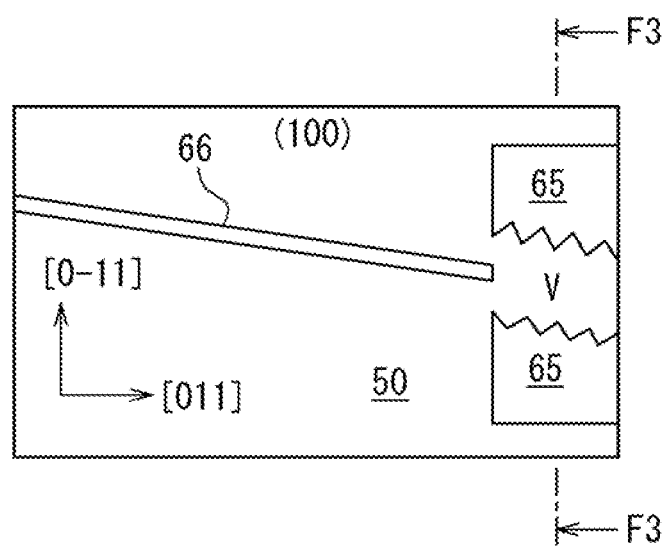
FIG. 38B is a diagram depicting a process (No. 6) of the second embodiment of the method of manufacturing an optical semiconductor integrated device disclosed in the specification.

FIG. 39A is an enlarged cross section taken along line F1-F1 of FIG. 38A. FIG. 40 is an enlarged cross section taken along line F2-F2 of FIG. 38A. FIG. 39B is an enlarged cross section taken along line F3-F3 of FIG. 38B.

Concretely, in the regions K1 and K2, as depicted in FIGS. 38A and 39A, a mask 63 is formed on the part of the contact layer 57 in which the pair of terraces 41b is formed, and a mask 64 is formed on the part of the contact layer 57 in which the mesa units 41d and 42a are formed. As the material of forming the masks 63 and 64, for example, silicon oxide can be used. Similarly, a mask (not depicted) is formed on the optical waveguide 43a, the coupler body 43b, and the optical waveguide 43c of the optical coupling unit 43. In the regions K4 and K5, as depicted in FIGS. 38B and 39B, a mask 66 is formed on the part of the contact layer 57 in which the mesa unit 44a of the second optical amplifying unit 44 is formed, and a mask 65 is formed on the part of the contact layer 57 in which the pair of terraces of the output unit 45 is formed.

In the regions K1 and K2, the contact layer 57, the second upper cladding layer 56, the third upper cladding layer 59, the core layer 58, the upper SCH layer 54, the active layer 53, the lower SCH layer 52, and the lower cladding layer 51 are etched using the masks 63, 64, and the like to expose the substrate 50.

As described with reference to FIG. 30A, the mask 63 includes the part having the orientation tilted to the [011] direction, facing the part in which the region V is formed. Concretely, as described with reference to FIG. 30A, the mask 63 includes parts each having orientation of 55° from the [011] direction toward the [0-11] direction and parts each having orientation of 145° from the [011] direction toward the [0-11] direction.

In the pair of terraces 41b formed by using such a mask 63, the opposed units 41c which are opposed to each other while sandwiching the region V include parts each having orientation tilted toward the [011] direction. Concretely, as described with reference to FIG. 30A, the opposed unit 41c is formed by alternately disposing the planes 61a and 61b and has a pattern of a triangular wave shape. The length in the [011] direction of the substrate 50 in the terrace 41b is 100 µm. The depth of the triangular-wave-shaped pattern in the opposed unit 41c is 2 µm. The shortest distance between the opposed units 41c is 10 µm.

The pair of terraces in the output unit 45 is also formed in a manner similar to the pair of terraces 41b in the input unit 41.

Figure 42A:
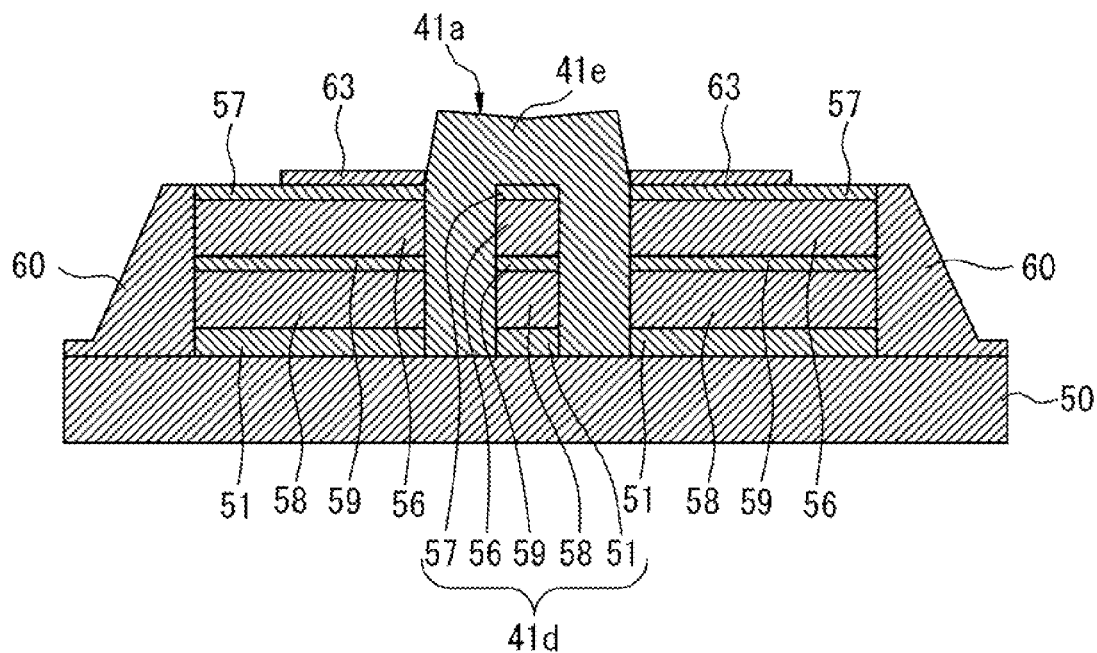
FIG. 42A is an enlarged cross section taken along line G1-G1 of FIG. 41.
Figure 42B:
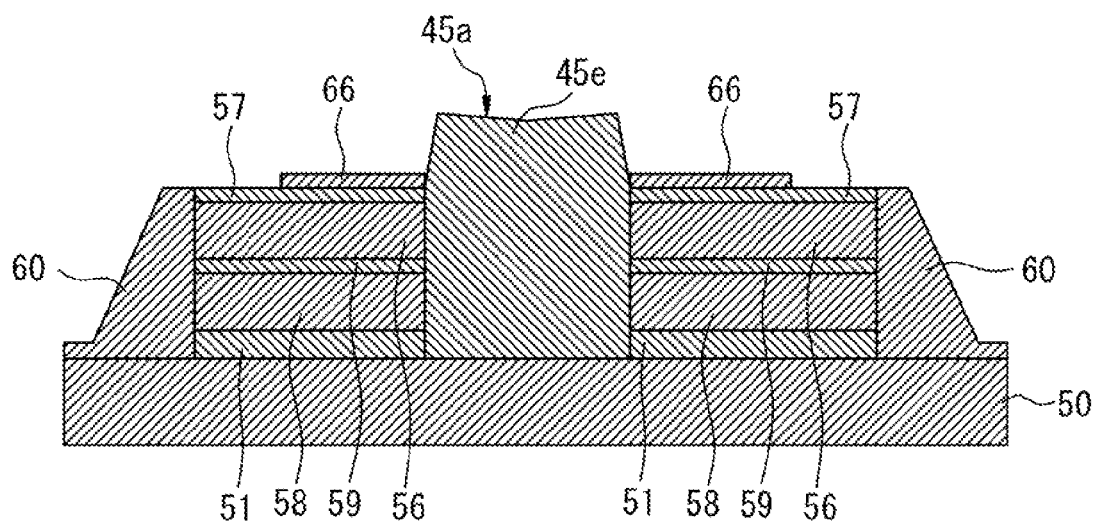
FIG. 42B is an enlarged cross section taken along line G3-G3 of FIG. 41.
Figure 43:
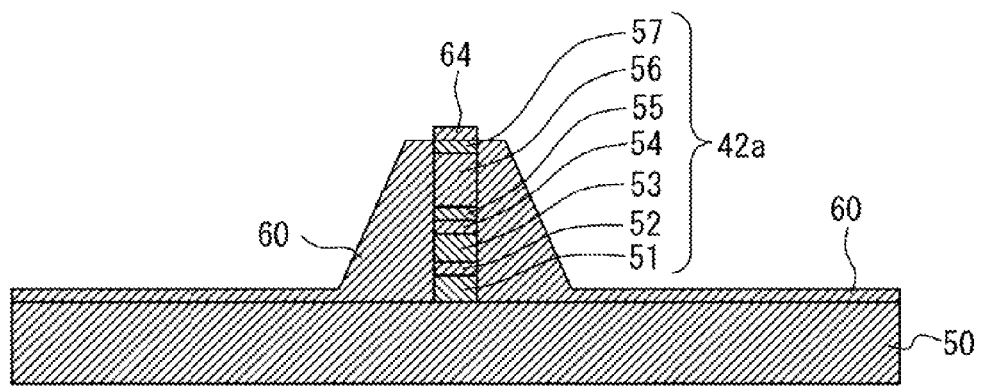
FIG. 43 is an enlarged cross section taken along line G2-G2 of FIG. 41.

As depicted in FIGS. 41 to 43, in the regions K1 and K2, the mask 63 is left on the region on the opposed unit 41c side in the pair of terraces 41b, and the mask 63 on the other region in the terraces 41d is removed. As described above, the mask 63 is removed except for a predetermined range on the opposed units 41c side of the pair of terraces 41b. Similarly, also in the regions K4 and K5, the mask 65 is removed except for a predetermined range on the opposed unit 45c side in the pair of terraces 45b.

Figure 41A:
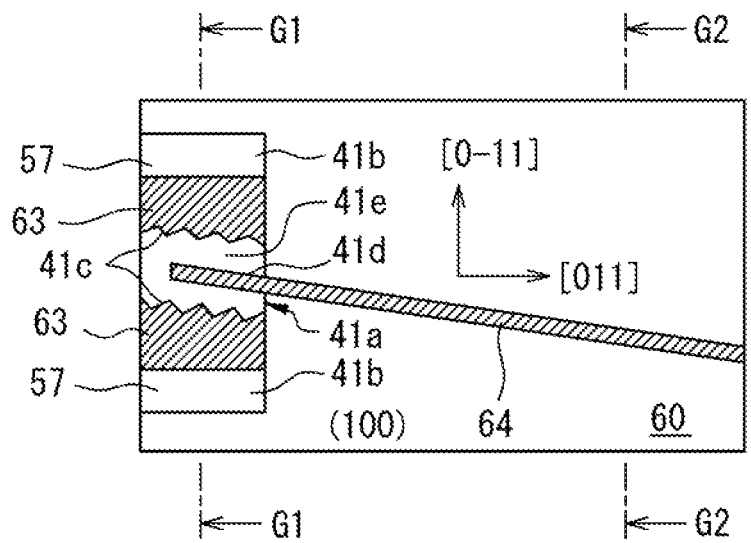
FIG. 41A is a diagram depicting a process (No. 7) of the second embodiment of the method of manufacturing an optical semiconductor integrated device disclosed in the specification.
Figure 41B:
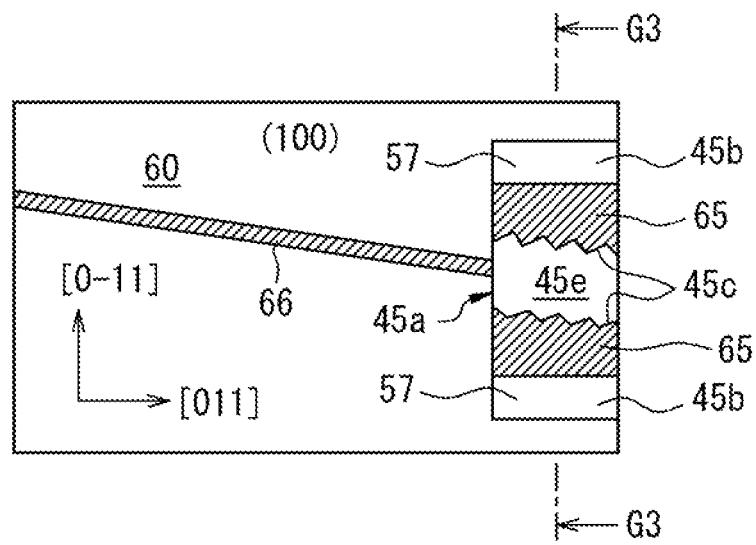
FIG. 41B is a diagram depicting a process (No. 8) of the second embodiment of the method of manufacturing an optical semiconductor integrated device disclosed in the specification.

FIG. 42A is an enlarged cross section taken along line G1-G1 of FIG. 41A. FIG. 43 is an enlarged cross section taken along line G2-G2 of FIG. 41A. FIG. 42B is an enlarged cross section taken along line G3-G3 of FIG. 41B.

The burying semiconductor layer 41e is formed so as to bury the region V including the mesa unit 41d between the pair of terraces 41b, and the burying layer 60 as semiconductor is formed on both sides of the mesa unit 42a in the first optical amplifying unit 42. The burying semiconductor layer 41e grows upward from each of the opposed units 41c. After that, the burying semiconductor layers 41e grow toward the opposed sides and are combined. Consequently, the position of the upper end of the first spot size converting unit 41a is higher than that of the upper end of the mesa unit 42a of the first optical amplifying unit 42.

The burying layer 60 is formed on both sides of the mesa unit 42a in the same thickness as that of the mesa unit 42a in predetermined distance from both sides of the mesa unit 42a.

The thickness decreases after the predetermined distance from the mesa unit 42a. The burying layer 60 is formed so as to bury side faces on the outside of the terraces 41b.

In the embodiment, the burying semiconductor layer 41e of semiconductor crystal and the burying layer 60 are formed by the MOVPE method. The burying semiconductor layer 41e and the burying layer 60 are formed simultaneously. The burying semiconductor layer 41e and the burying layer 60 are formed by using InP to which Fe of semi-insulating semiconductor is added. The position of the upper end of the burying semiconductor layer 41e is higher than that of the upper end of the mesa unit 42a in the first optical amplifying unit 42 by 3 µm. The position of the upper end of the mesa unit 42a in the first optical amplifying unit 42 coincides with that of the upper end of the mesa structure of the optical coupling unit 43 and the mesa unit 44a in the second optical amplifying unit 44.

In the MOVPE method of the embodiment, the burying semiconductor layer 41e and the burying layer 60 are formed by using process gas containing chlorine. Concretely, as process gas for forming the burying semiconductor layer 41e and the burying layer 60, 1,2-dichloroethylene as the material of the gas containing chlorine, and trimethyl indium (TMI), phosphine, and ferrocene as the materials for forming InP of semi-insulating semiconductor are used.

In the region K5, the burying semiconductor layer 45e for forming the second spot size converting unit 45a of the output unit 45 is similarly formed simultaneously with the burying semiconductor layer 41e for forming the first spot size converting unit 41a of the input unit 41. The burying semiconductor layers 41e and 45e are formed by using the same semiconductor. Both sides of the optical waveguide 43a, the coupler body 43b, and the optical guide 43c of the optical coupling unit 43 and the mesa unit 44a of the second optical amplifying unit 44 are buried with the burying layer 60. The masks 63 to 66 and the like are removed.

By using the metal evaporation or plating technique, a first electrode (not depicted) is formed on the contact layer 57 of the mesa unit 42a in the first optical amplifying unit 42 and the mesa unit 44a of the second optical amplifying unit 44. A second electrode (not depicted) is formed on the rear face of the substrate 50. The part other than the first electrode is covered with a passivation film (not depicted) made of dielectric or the like. In such a manner, the optical semiconductor integrated device depicted in FIGS. 28 to 33 is obtained.

In the optical semiconductor integrated device 40 of the embodiment, in the input unit 41 which receives light from the outside, the position of the upper end of the first spot size converting unit 41a is higher than that of the upper end of the mesa unit 42a in the first optical amplifying unit 42. Therefore, the light coupling loss caused by the difference between the spot size of light which is incident on the optical semiconductor integrated device 40 from the outside and the spot size of the light of the first optical amplifying unit 42 is suppressed. Similarly, in the output unit 45 which outputs light to the outside, the light coupling loss caused by the difference between the spot size of light which is output to the outside of the optical semiconductor integrated device 40 and the spot size of the light of the second optical amplifying unit 44 is suppressed.

In the method of manufacturing the optical semiconductor integrated device of the embodiment, the burying semiconductor layer 41e of the input unit 41 and the burying semiconductor layer 45e of the output unit 45 can be formed by using the process gas containing chlorine. In such a manner, the optical semiconductor integrated device 40 in which the light coupling loss caused by the difference between the spot sizes is suppressed is obtained.

In the method of manufacturing the optical semiconductor integrated device of the embodiment, even if the orientation in the longitudinal direction of the mesa structure has a [011] direction component and a [0-11] direction component, the burying layer 60 is not formed so as to cover the upper side of the contact layer of the mesa structure from both sides of the mesa structure. Therefore, by the method of manufacturing the optical semiconductor integrated device of the embodiment, the flexibility of the designing of the optical semiconductor integrated device is not limited.

By using such a manufacturing method, the spot size converting unit which reduces the coupling loss of light with an optical fiber can be monolithically integrated on the optical semiconductor integrated device.

A modification of the optical semiconductor integrated device of the second embodiment will be described with reference to the drawings. The same elements are designated by the same reference numerals.

Figure 44:
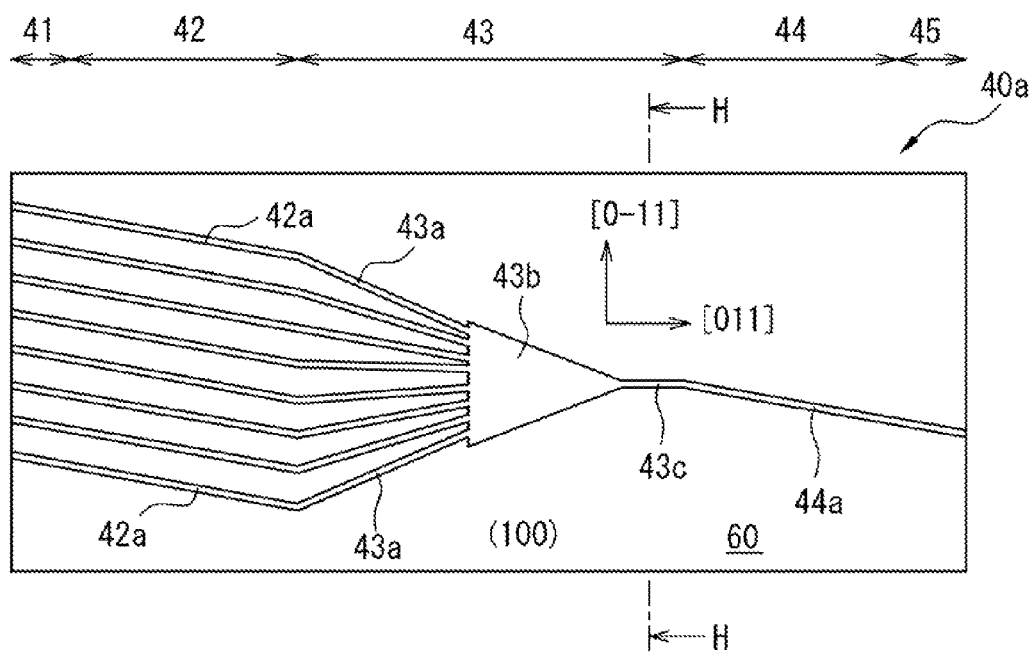
FIG. 44 is a diagram depicting a modification of the second embodiment of the method of manufacturing an optical semiconductor integrated device disclosed in the specification.
Figure 45:
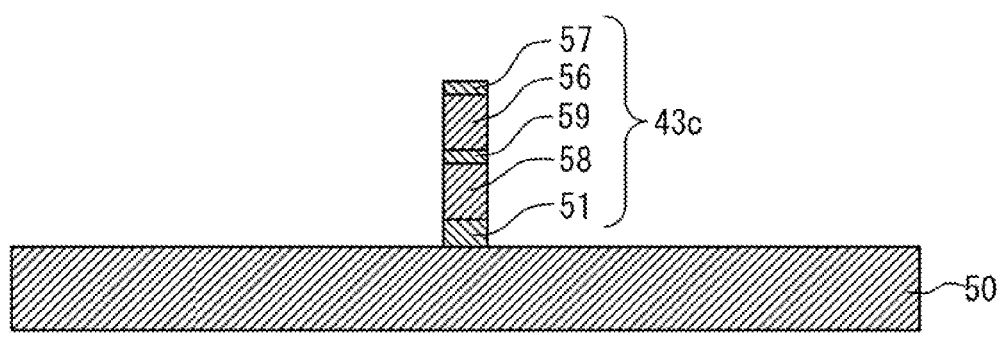
FIG. 45 is an enlarged cross section taken along line H-H of FIG. 44.

FIG. 44 is a diagram depicting a modification of the second embodiment of the method of manufacturing an optical semiconductor integrated device disclosed in the specification. FIG. 45 is an enlarged cross section taken along line H-H of FIG. 44.

An optical semiconductor integrated device 40a of the modification is different from that of the second embodiment with respect to the point that the mesa structure of the optical coupling unit 43 is not buried with the burying layer.

As depicted in FIG. 45, the optical waveguide 43c of the optical coupling unit 43 is not buried with the burying layer. The optical waveguide 43c is buried with air. In the foregoing second embodiment, as depicted in FIG. 33, the optical waveguide 43c of the optical coupling unit 43 is buried with the burying layer 60.

In the optical semiconductor integrated device 40a of the modification, like the optical waveguide 43c, the optical waveguide 43a and the coupler body 43b are also buried with air.

In the optical semiconductor integrated device 40a of the modification, the mesa structure of the optical coupling unit 43 is buried with air. Consequently, by the large difference in the refractive index between the core layer 58 of the optical coupling unit 43 and the air, light can be confined in the core layer 58 of the optical coupling unit 43. Therefore, the size of the mesa structure of the optical coupling unit 43 can be decreased.

Alternatively, by burying the mesa structure of the optical coupling unit 43 with an organic material having low permittivity in place of air, similar effects are obtained. A part on the mesa unit 42a side of the first optical amplifying unit 42 in the optical waveguide 43a may be buried with the semiconductor burying layer 60. A part of the mesa unit 44a of the second optical amplifying unit 44 in the optical waveguide 43c may be buried with the semiconductor burying layer 60.

In the present invention, the optical semiconductor device and the method of manufacturing the optical semiconductor device can be properly changed without departing from the gist of the invention. Components of an embodiment can also be applied to another embodiment.

For example, in the optical semiconductor integrated device including the spot size converting unit, a passive optical waveguide is integrated together with the photodetector or the light amplifying unit. In the optical semiconductor integrated device, only the passive optical waveguide may be integrated together with the spot size converting unit.

In the optical semiconductor integrated device including the spot size converting unit, an optical function device or the like including a semiconductor laser or a semiconductor light modulator may be monolithically integrated.

In the above-described optical semiconductor integrated device, the spot size converting unit or the burying layer is formed by using InP of semi-insulating semiconductor to which Fe is added, and the semi-insulating semiconductor which captures electrons is used. The spot size converting unit or the burying layer may be formed by using a semi-insulating semiconductor which captures holes such as Ru-doped InP, Ti-doped InP, or the like.

In the method of manufacturing the optical semiconductor integrated device, as the organochlorine material, 1,2-dichloroethylene is used. As the organochlorine material, for example, another organochlorine material such as methyl chloride, ethyl chloride, 1,2-dichloroethane, or 1,2-dichloropropane may be used.

Further, the compound semiconductor for forming the optical semiconductor integrated device is not limited to the above-described materials. A mixed crystal semiconductor such as AlGaInAs, AlGaInP, InGaP, InGaAs, InGaAsN, or InGaAsSb may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device comprising:
   a waveguide unit which is formed on a semiconductor substrate having a (100) plane and includes a core layer which propagates light;
   a spot size converting unit which is formed on the semiconductor substrate, is optically connected to the waveguide unit, and converts diameter of light propagated; and
   a pair of terraces which are formed on the semiconductor substrate and opposed to each other while sandwiching the spot size converting unit,
   wherein interval between opposed units which are opposed to each other while sandwiching the spot size converting unit in the pair of terraces changes, and each of the opposed units includes a part whose orientation tilts to a [0-11] direction with respect to a [011] direction, and
   position of an upper end of the spot size converting unit is higher than position of an upper end of the waveguide unit.

2. The optical semiconductor device according to claim 1, wherein the interval of the pair of terraces repeats enlargement and reduction.

3. The optical semiconductor device according to claim 1, wherein a part higher than the upper end of the waveguide unit in the spot size converting unit has a shape corresponding to the part whose orientation tilts to the [0-11] direction with respect to the [011] direction in the opposed unit.

4. The optical semiconductor device according to claim 1, wherein the opposed unit in the pair of terraces includes a part tilted at 30 degrees to 85 degrees toward the [0-11] direction from the [011] direction.

5. The optical semiconductor device according to claim 4, wherein the opposed unit in the pair of terraces includes a part tilted at 40 degrees to 50 degrees toward the [0-11] direction from the [011] direction.

6. The optical semiconductor device according to claim 4, wherein the opposed unit in the pair of terraces includes a part tilted at 45 degrees toward the [0-11] direction from the [011] direction.

7. The optical semiconductor device according to claim 1, wherein the spot size converting unit includes a second core layer which is extended from the core layer.

8. The optical semiconductor device according to claim 7, wherein an end width of the second core layer on the waveguide unit side is wider than an end width on the opposite side to the waveguide unit.

9. The optical semiconductor device according to claim 7, wherein the second core layer extends, in the spot size converting unit, from the waveguide unit side to an end in the direction opposite to the waveguide unit side of the spot size converting unit.

10. The optical semiconductor device according to claim 1, wherein shortest distance between the opposed units in the pair of terraces is 20 µm or less.

11. The optical semiconductor device according to claim 1, wherein extension orientation of the core layer includes a [011] direction component and a [0-11] direction component.

12. A method of manufacturing an optical semiconductor device comprising:
    forming, on a semiconductor substrate having a (100) plane, a mesa unit including a shape extending in one direction and a pair of terraces sandwiching a region extending from the mesa unit along the longitudinal direction of the mesa unit toward a direction opposite to the mesa unit, the mesa unit and the pair of terraces being formed so that opposed units which are opposed to each other while sandwiching the region in the pair of terraces include a part whose orientation tilts in a [0-11] direction with respect to a [011] direction; and
    forming a first semiconductor layer in the region between the pair of terraces and forming a second semiconductor layer which buries the mesa unit on both sides of at least a part of the mesa unit, position of an upper end of the first semiconductor layer being higher than position of an upper end of the mesa unit.

13. The method of manufacturing an optical semiconductor device according to claim 12, wherein in formation of the mesa unit and the pair of terraces, the pair of terraces is formed so that the interval between the opposed units changes.

14. The method of manufacturing an optical semiconductor device according to claim 12, wherein in formation of the mesa unit and the pair of terraces, a mask is formed on the portion where the mesa unit and the pair of terraces are to be formed, and the mesa unit and the pair of terraces are formed by using the mask so that the mesa unit extends in the region, and
    further comprising, removing the mask on the part of the mesa unit extending in the region between the formation of the mesa unit and the pair of terraces and formation of the first and second semiconductor layers.

15. The method of manufacturing an optical semiconductor device according to claim 14, further comprising removing the mask except for a predetermined range on the side of the opposed units in the pair of terraces, between the formation of the mesa unit and the pair of terraces and the formation of the first and second semiconductor layers.

16. The method of manufacturing an optical semiconductor device according to claim 12, wherein in formation of the first and second semiconductor layers, the first semiconductor layer and the second semiconductor layer are formed by using gas containing chlorine.

* * * * *